(12) United States Patent
Wen et al.

(10) Patent No.: US 11,566,898 B2
(45) Date of Patent: Jan. 31, 2023

(54) COMB-DRIVEN SUBSTRATE DECOUPLED ANNULUS PITCH/ROLL BAW GYROSCOPE WITH SLANTED QUADRATURE TUNING ELECTRODE

(71) Applicant: Georgia Tech Research Corporation, Atlanta, GA (US)

(72) Inventors: Haoran Wen, Atlanta, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 17/463,689

(22) Filed: Sep. 1, 2021

(65) Prior Publication Data

US 2021/0396518 A1 Dec. 23, 2021

Related U.S. Application Data

(62) Division of application No. 15/771,453, filed as application No. PCT/US2016/059408 on Oct. 28, 2016, now Pat. No. 11,137,250.

(Continued)

(51) Int. Cl.
*G01C 19/5684* (2012.01)
*G01C 19/56* (2012.01)
(Continued)

(52) U.S. Cl.
CPC ..... *G01C 19/5698* (2013.01); *G01C 19/5719* (2013.01); *H03H 9/02228* (2013.01);
(Continued)

(58) Field of Classification Search
CPC ............ G01C 19/5677; G01C 19/5684; G01C 19/5698; B81B 2201/033; B81B 2203/0136; B81C 1/00166
See application file for complete search history.

(56) References Cited

U.S. PATENT DOCUMENTS

| 5,548,178 A | 8/1996 | Eda et al. |
| 6,889,550 B2 | 5/2005 | Beitia |

(Continued)

FOREIGN PATENT DOCUMENTS

| WO | 2015063727 A1 | 5/2015 |
| WO | 2016201413 A1 | 12/2016 |

OTHER PUBLICATIONS

Acar et al. "Post-Release Capacitance Enhancement in Micromachined Devices" Proceedings of IEEE Sensors 2004 1:268-271 (Oct. 2004).

(Continued)

*Primary Examiner* — Jill E Culler
*Assistant Examiner* — Ruben C Parco, Jr.
(74) *Attorney, Agent, or Firm* — Myers Bigel, P.A.

(57) ABSTRACT

A bulk acoustic wave resonator apparatus includes a resonator member, at least one anchor structure coupling the resonator member to a substrate, and a comb-drive element connected to the resonator member. The comb-drive element includes first comb fingers protruding from the resonator member, and second comb fingers of a different material than the first comb fingers interdigitated with the first comb fingers to define sub-micron capacitive gaps therebetween. Respective sidewalls of the first comb fingers are oppositely-tapered relative to respective sidewalls of the second comb fingers along respective lengths thereof, such that operation of the comb-drive element varies the sub-micron capacitive gaps at the respective sidewalls thereof. Respective tuning electrodes, which are slanted at respective angles parallel to an angle of respective sidewalls of the resonator member, may also be provided for quadrature tuning between different resonance modes of the resonator member. Related devices and fabrication methods are also discussed.

15 Claims, 12 Drawing Sheets

Related U.S. Application Data

(60) Provisional application No. 62/349,700, filed on Jun. 14, 2016, provisional application No. 62/247,267, filed on Oct. 28, 2015.

(51) Int. Cl.
  *G01C 19/5698* (2012.01)
  *G01C 19/5719* (2012.01)
  *H03H 9/02* (2006.01)
  *G01C 19/5677* (2012.01)

(52) U.S. Cl.
  CPC . *B81B 2201/033* (2013.01); *B81B 2203/0136* (2013.01); *G01C 19/5677* (2013.01); *G01C 19/5684* (2013.01)

(56) References Cited

U.S. PATENT DOCUMENTS

| | | | |
|---|---|---|---|
| 8,166,816 | B2 | 5/2012 | Ayazi et al. |
| 8,763,441 | B2 | 7/2014 | Casinovi et al. |
| 2002/0083777 | A1 | 7/2002 | Mochida |
| 2002/0180563 | A1 | 12/2002 | Ma et al. |
| 2005/0248238 | A1 | 11/2005 | Yamada et al. |
| 2006/0091978 | A1 | 5/2006 | Wang et al. |
| 2006/0225504 | A1 | 10/2006 | Ayazi et al. |
| 2007/0222011 | A1 | 9/2007 | Robert et al. |
| 2009/0095079 | A1 | 4/2009 | Ayazi |
| 2010/0251818 | A1 | 10/2010 | Ge et al. |
| 2011/0298564 | A1 | 12/2011 | Iwashita et al. |
| 2013/0009716 | A1 | 1/2013 | Phan Le |
| 2013/0283911 | A1 | 10/2013 | Ayazi et al. |
| 2014/0197502 | A1 | 7/2014 | Dehe |
| 2014/0230549 | A1 | 8/2014 | McNeil et al. |
| 2015/0021722 | A1 | 1/2015 | Dehe et al. |
| 2015/0377624 | A1 | 12/2015 | Falorni et al. |
| 2016/0204716 | A1 | 7/2016 | Suzuki et al. |
| 2016/0268927 | A1 | 9/2016 | Liu et al. |
| 2016/0327390 | A1 | 11/2016 | Serrano et al. |
| 2016/0332872 | A1 | 11/2016 | Iihola et al. |
| 2017/0067742 | A1 | 3/2017 | Zotov et al. |
| 2017/0170801 | A1 | 6/2017 | Tajic et al. |
| 2018/0194615 | A1* | 7/2018 | Nawaz ............... B81B 7/0032 |
| 2018/0321037 | A1 | 11/2018 | Wen et al. |

OTHER PUBLICATIONS

Ayazi et al. "High Aspect-Ratio Combined Poly and Single-Crystal Silicon (HARPSS) MEMS Technology" Journal of Microelectromechanical Systems 9(3):288-294 (Sep. 2000).

Ayazi, Farrokh "Multi-DOF inertial MEMS: From gaming to dead reckoning" 2011 16th International Solid-State Sensors, Actuators and Microsystems Conference (pp. 2805-2808) (Jun. 2011).

Jensen et al. "Shaped Comb Fingers for Tailored Electromechanical Restoring Force" Journal of Microelectromechanical Systems 12(3):373-383 (Jun. 2003).

Kaajakari et al. "Nonlinear Limits for Single-Crystal Silicon Microresonators" Journal of Microelectromechanical Systems 13(5):715-724 (Oct. 2004).

Notification of Transmittal of the International Search Report and the Written Opinion of the International Searching Authority, or the Declaration, in corresponding PCT Application No. PCT/US2016/059408 (11 pages) (Dec. 29, 2016).

Pourkamali et al. "Low-impedance VHF and UHF Capacitive Silicon Bulk Acoustic Wave Resonators—Part I Concept and Fabrication" IEEE Transactions on Electron Devices 54(8):2017-2023 (Aug. 2007).

Pourkamali et al. "Low-Impedance VHF and UHF Capacitive Silicon Bulk Acoustic-Wave Resonators—Part II: Measurement and Characterization" IEEE Transactions on Electron Devices 54(8):2024-2030 (Aug. 2007).

Rosa et al. "Enhanced electrostatic force generation capability of angled comb finger design used in electrostatic comb-drive actuators" Electronics Letters 34(18):1787-1788 (Sep. 1998).

Shirazi et al. "Combined Phase-Readout and Self-Calibration of MEMS Gyroscopes" 2013 Transducers & Eurosensors XXVII: The 17th International Conference on Solid-State Sensors, Actuators and Microsystems (pp. 960-963) (Jun. 2013).

Sung et al. "A mode-matched 0.9 MHZ single proof-mass dual-axis gyroscope" 2011 16th International Solid-State Sensors, Actuators and Microsystems Conference (pp. 2821-2824) (Jun. 2011).

Wen et al. "HARPSS-Fabricated Nano-Gap Comb-Drive for Efficient Linear Actuation of High Frequency BAW Resonators" 2016 IEEE 29th International Conference on Micro Electro Mechanical Systems (MEMS) (pp. 1014-1017) (Jan. 2016).

Yang et al. "Measurement of the Nonlinear Elasticity of Doped Bulk-mode MEMS Resonators" Solid-State Sensors, Actuators and Microsystems Workshop (pp. 285-288) (Jun. 2014).

Ye et al. "Optimal Shape Design of an Electrostatic Comb Drive in Microelectromechanical Systems" Journal of Microelectromechanical Systems 7(1):16-26 (Mar. 1998).

Shahmohammadi et al. "Nonlinearity Reduction in Silicon Resonators by Doping and Re-Orientation" 2013 IEEE 26th International Conference on Micro Electro Mechanical Systems (MEMS) (pp. 793-796) (Jan. 2013).

* cited by examiner

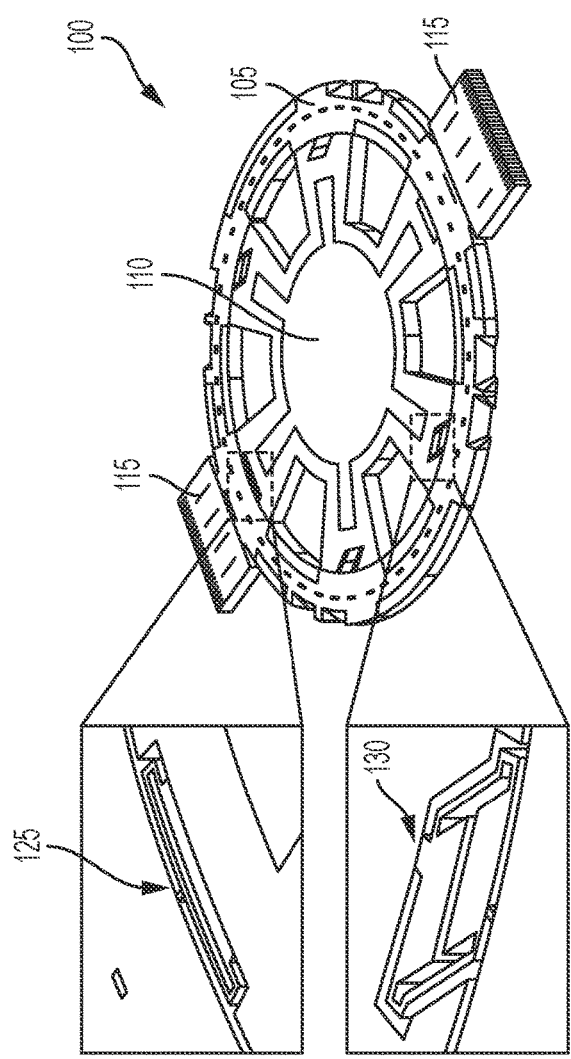
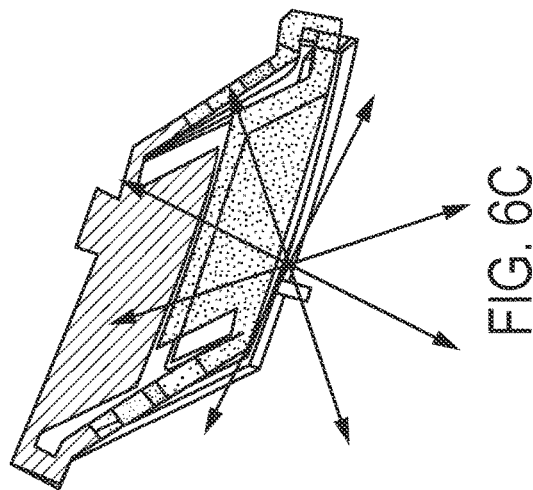
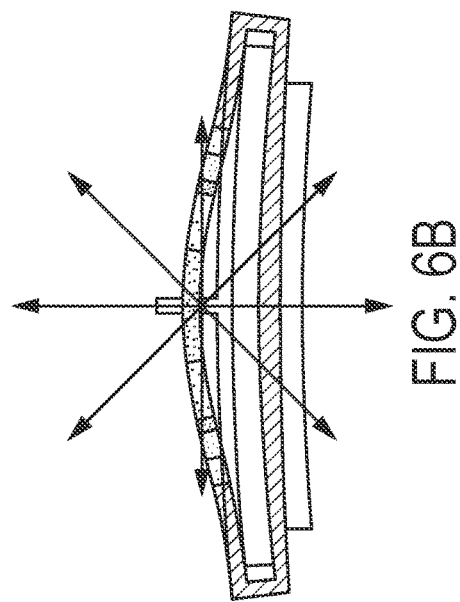
FIG. 6A
FIG. 6B
FIG. 6C

COMB-DRIVEN SUBSTRATE DECOUPLED ANNULUS PITCH/ROLL BAW GYROSCOPE WITH SLANTED QUADRATURE TUNING ELECTRODE

CLAIM OF PRIORITY

This application is a divisional of and claims priority from U.S. application Ser. No. 15/771,453, filed Apr. 27, 2018, which is a 35 U.S.C. § 371 national phase application of PCT Application Serial No. PCT/US2016/059408, filed Oct. 28, 2016, which claims priority from U.S. Provisional Patent Application No. 62/247,267 entitled "COMB-DRIVEN SUBSTRATE DECOUPLED ANNULUS PITCH/ROLL BAW GYROSCOPE WITH SLANTED QUADRATURE TUNING ELECTRODE" and filed Oct. 28, 2015, in the United States Patent and Trademark Office, the disclosure of which is incorporated by reference herein in its entirety. This application also claims priority from U.S. Provisional Patent Application No. 62/349,700 entitled "FABRICATION METHOD FOR SLANTED ELECTRODES IN SINGLE-CRYSTAL SILICON MEMS DEVICES" and filed Jun. 14, 2016, in the United States Patent and Trademark Office, the disclosure of which is incorporated by reference herein in its entirety.

STATEMENT OF GOVERNMENT INTEREST

The subject matter disclosed herein was funded in-part by the Defense Advanced Research Projects Agency Microsystems Technology Office, Single-Chip Timing and Inertial Measurement Unit (TIMU) program, Project No. 2106CDD, under Contract No. N66001-11-C-4176. The U.S. government may have rights in the present disclosure.

FIELD

The present disclosure relates to MEMS (Micro-electromechanical systems), and more particularly, to MEMS resonators and related operation and fabrication techniques.

BACKGROUND

Micro-electromechanical system (MEMS) resonators can provide small form factor, ease of integration with conventional semiconductor fabrication techniques and high f-Q products. High frequency and high-Q width-extensional mode silicon bulk acoustic resonators (SiBARs) and film bulk acoustic resonators (FBARs) have demonstrated atmospheric Q factors in excess of 10,000 at or above 100 MHz, with moderate motional resistances. Bulk acoustic wave (BAW) refers to a mode of vibration that extends throughout a bulk portion of a resonator element or member. Movement of the resonator element towards a sense electrode changes the capacitive gap spacing therebetween, thereby altering the resonant frequency of the device. Such BAW resonators are described in the publication "*Low-impedance VHF and UHF Capacitive Silicon Bulk Acoustic Wave Resonators— Part I: Concept and Fabrication*" to S. Pourkamali et al., IEEE Trans. On Electron Devices, Vol. 54, No. 8, pp. 2017-2023, August 2007, the disclosure of which is incorporated herein by reference in its entirety.

Tri-axial gyroscopes are a type of MEMS resonator that may be increasingly used in handheld devices, such as smart user interfaces and gaming controllers that may require multi-dimensional motion recognition for accurate positioning. Some tri-axial gyroscopes are described in the publication "MULTI-DOF INERTIAL MEMS: FROM GAMING TO DEAD RECKONING" to F. Ayazi, Digest Tech. Papers Transducers '11 Conference, Beijing, China, pp. 2805-2808, 2011, the disclosure of which is incorporated herein by reference in its entirety.

While some conventional vibratory gyroscopes utilize separate proof masses for each axis' rate measurement, some gyroscopes may employ a single proof-mass for simultaneous dual-axis pitch and roll rate sensing (i.e., x- and y-axis), and may be formed, for example, using a revised version of the high-aspect-ratio polysilicon and single-crystal silicon (HARPSS)™ process. Such single-proof mass gyroscopes are described in the publication "*A MODE-MATCHED 0.9 MHZ SINGLE PROOF-MASS DUAL-AXIS GYROSCOPE*" to W. K. Sung, et al., Digest Tech. Papers Transducers '11 Conference, pp. 2821-2824, 2011, the disclosure of which is incorporated herein by reference in its entirety. The HARPSS™ process is further described in the publication "*High Aspect-Ratio Combined Poly and Single-Crystal Silicon (HARPSS) MEMS Technology*" to F. Ayazi and K. Najafi, J. Microelectromech. Syst., Vol. 9, pp. 288-294, 2000, the disclosure of which is incorporated herein by reference in its entirety. High-aspect-ratio polysilicon and single-crystal silicon (HARPSS)-on-silicon-on-insulator (SOI) silicon bulk acoustic-wave resonators are also described in the publication "*Low-Impedance VHF and UHF Capacitive Silicon Bulk Acoustic-Wave Resonators— Part II: Measurement and Characterization*" to S. Pourkamali, et al., Transactions on Electron Devices, Vol. 54, pp. 2024-2030, 2007, the disclosure of which is incorporated herein by reference in its entirety.

BAW gyroscopes are further described in U.S. Pat. No. 8,166,816 to Ayazi et al., entitled "BULK ACOUSTIC WAVE GYROSCOPE" issued May 1, 2012, the disclosure of which is incorporated herein by reference in its entirety. A self-calibration mechanism, which relies on application of a rotating electrostatic field to first and second drive electrodes simultaneously to excite both the drive and sense resonance modes of the gyroscope (and thus does not require physical rotation of the resonant body of the gyroscope) is described in U.S. Pat. No. 8,763,441 to Casinovi et al., entitled "METHOD AND APPARATUS FOR SELF-CALIBRATION OF GYROSCOPES" issued Jul. 1, 2014, and Shirazi, et al, "Combined Phase-Readout and Self-Calibration of MEMS Gyroscopes," Digest Tech. Papers Transducers 2013 Conference, Barcelona, Spain, pp. 960-963, 2013, the disclosures of which are incorporated herein by reference in their entireties.

SUMMARY

According to some embodiments, a bulk acoustic wave resonator apparatus includes a resonator member, at least one anchor structure coupling the resonator member to a substrate, and a comb-drive element connected to the resonator member. The comb-drive element includes first comb fingers protruding from the resonator member, and second comb fingers interdigitated with the first comb fingers to define sub-micron capacitive gaps therebetween.

In some embodiments, the first comb fingers include a different material than the second comb fingers.

In some embodiments, respective sidewalls of the second comb fingers are oppositely-tapered relative to respective sidewalls of the first comb fingers along respective lengths between opposing thereof, such that operation of the comb-drive element varies or reduces the sub-micron capacitive gaps at the respective sidewalls of the first and second comb fingers.

In some embodiments, the respective sidewalls of the first comb and second comb fingers are tapered at an angle relative to respective lengths thereof such that a linear drive range of the comb-drive element exceeds a mechanical non-linearity limit of the resonator member.

In some embodiments, the resonator member is an annulus, and the angle is in a range of about 1 degree to about 10 degrees, or in a range of about 1 degree to about 5 degrees.

In some embodiments, the second comb fingers are free of connection to one another at either of the opposing ends thereof.

In some embodiments, the first comb fingers are longer than the second comb fingers along respective lengths between the opposing ends thereof, and the second comb fingers are confined within trenches defined by the respective sidewalls of the first comb fingers.

In some embodiments, the second comb fingers are self-aligned within the trenches defined by the respective sidewalls of the first comb fingers.

In some embodiments, the first comb fingers are single-crystal silicon.

In some embodiments, the second comb fingers are poly-silicon.

In some embodiments, a polysilicon layer connects the second comb fingers at respective surfaces thereof opposite the substrate such that the polysilicon layer and the second comb fingers define a unitary member.

In some embodiments, the polysilicon layer is coupled to the substrate by a single crystal silicon anchor.

In some embodiments, the resonator member is single-crystal silicon, and the first comb fingers are connected at one of the opposing ends thereof adjacent a perimeter of the resonator member such that the resonator member and the first comb fingers define a unitary member.

In some embodiments, the sub-micron capacitive gaps are between about 100 nanometers (nm) and 500 nm.

In some embodiments, a resonance frequency of the apparatus is greater than about 300 kilohertz (kHz).

In some embodiments, the apparatus is a gyroscope.

In some embodiments, the gyroscope is a pitch/roll gyroscope.

In some embodiments, the resonator member is an annulus.

In some embodiments, the comb-drive element is connected to a perimeter of the annulus at an anti-nodal point for an in-plane drive mode thereof, where movement of the resonator member in the in-plane drive mode is parallel to a plane defined by a surface of the substrate.

In some embodiments, the comb-drive element is a first comb-drive element. The apparatus further includes a second comb-drive element connected to the perimeter of the annulus at a location opposite to the first comb-drive element. The first comb-drive element is a drive electrode configured to actuate the resonator member, and the second comb-drive element is a sense electrode configured to detect movement of the resonator member.

In some embodiments, the apparatus is configured to utilize an in-plane drive mode, a first orthogonal out-of-plane sense mode orthogonal to the in-plane drive mode, and a second orthogonal out-of-plane sense mode orthogonal to the first orthogonal out-of-plane sense mode and the in-plane drive mode.

In some embodiments, a perimeter of the resonator member is at least partially defined by respective sidewalls that are slanted at an angle relative to a plane defined by a surface of the resonator member.

In some embodiments, the resonator member is single crystal silicon. The angle is defined by a (111) crystal plane of the single-crystal silicon resonator member to be about 54.7 degrees.

In some embodiments, respective tuning electrodes are disposed adjacent the respective sidewalls and/or a top surface of the resonator member and are separated therefrom by respective capacitive gaps. Portions of the respective tuning electrodes are slanted at respective angles parallel to the angle of the respective sidewalls of the resonator member to define the respective capacitive gaps.

In some embodiments, the tuning electrodes are positioned along the perimeter of the annulus at spacings of approximately 90 degrees.

In some embodiments, the tuning electrodes are positioned along the perimeter of the annulus between nodal points for the in-plane drive mode thereof and an out-of-plane sense mode thereof.

In some embodiments, the respective tuning electrodes are quadrature cancellation electrodes. Responsive to application of a quadrature tuning voltage thereto, the respective tuning electrodes are configured to produce a corresponding electrostatic force that provides a torque in a direction between an in-plane direction that is parallel to a surface of the substrate and an out-of-plane direction that is orthogonal to the in-plane direction.

In some embodiments, responsive to application of a quadrature tuning voltage to the respective tuning electrodes, a frequency of an in-plane drive mode of the resonator member and a frequency of an out-of-plane sense mode of the resonator member, which is orthogonal to the in-plane drive mode, are mode-matched. That is, the resonant member may be operated at a mode-matched condition in which the resonance frequencies for an in-plane drive mode and at least one out-of-plane sense mode are located at a specific frequency.

In some embodiments, the at least one anchor structure includes respective anchor structures coupling the resonator member to the substrate at different locations of the resonator member. Respective tether structures couple the respective anchor structures to the resonator member at the different locations thereof, where ones of the respective tether structures at the different locations of the resonator member have different shapes.

In some embodiments, the respective tether structures are coupled to the resonator member at respective nodal points for an out-of-plane sense mode thereof, where movement of the resonator member in the out-of-plane sense mode is non-parallel to a plane defined by a surface of the substrate.

In some embodiments, the different shapes are configured to confine movement of portions of the resonator member to coincide with local deformations corresponding to an in-plane drive mode, where movement of the resonator member in the in-plane drive mode is parallel to a plane defined by a surface of the substrate.

In some embodiments, the resonator member is an annulus, the respective anchor structures and tether structures are positioned within an interior of the annulus at the different locations relative to the comb-drive element, and the respective anchor structures are coupled to one another by a disk-shaped member.

According to further embodiments, a method of fabricating a bulk acoustic wave resonator apparatus includes forming a comb-drive element connected to a resonator member. The comb-drive element includes first comb fingers protruding from the resonator member, and second comb fingers interdigitated with the first comb fingers to define sub-micron capacitive gaps therebetween.

In some embodiments, forming the comb-drive element includes forming the first comb fingers of a first material, and forming the second comb fingers of a second material different from the first material.

In some embodiments, forming the comb-drive element includes forming respective sidewalls of the second comb fingers oppositely-tapered relative to respective sidewalls of the first comb fingers between opposing ends thereof such that operation of the comb-drive element varies the sub-micron capacitive gaps at the respective sidewalls of the first and second comb fingers.

In some embodiments, the respective sidewalls of the first comb and second comb fingers are formed tapered at an angle relative to respective lengths thereof such that a linear drive range of the comb-drive element exceeds a mechanical non-linearity limit of the resonator member.

In some embodiments, the resonator member is an annulus, and wherein the angle is in a range of about 1 degree to about 10 degrees, or in a range of about 1 degree to about 5 degrees.

In some embodiments, forming the comb-drive element includes forming the second comb fingers free of connection to one another at either of the opposing ends thereof.

In some embodiments, the first comb fingers are longer than the second comb fingers along respective lengths between the opposing ends thereof, and the second comb fingers are formed to be confined within trenches defined by the respective sidewalls of the first comb fingers.

In some embodiments, forming the second comb fingers includes forming an oxide layer along the respective sidewalls of the first comb fingers of the first material defining the trenches, forming the second comb fingers of the second material within the trenches such that the opposing ends thereof are not connected, and removing the oxide layer such that the second comb fingers are self-aligned within the trenches.

In some embodiments, the first material is single-crystal silicon.

In some embodiments, the second material is polysilicon.

In some embodiments, a polysilicon layer is formed connecting the second comb fingers at respective surfaces thereof opposite the substrate such that the polysilicon layer and the second comb fingers define a unitary member.

According to still further embodiments, a bulk acoustic wave pitch/roll gyroscope having a resonance frequency of greater than about 300 kilohertz (kHz) includes an annulus-shaped resonator member, respective anchor structures coupling the annulus-shaped resonator member to a substrate, and a comb-drive element connected to the annulus-shaped resonator member. The comb-drive element includes first comb fingers protruding from the annulus-shaped resonator member, and second comb fingers of a different material than the first comb fingers interdigitated therewith to define capacitive gaps of less than about 500 nanometers (nm) therebetween. Respective sidewalls of the second comb fingers are oppositely-tapered relative to respective sidewalls of the first comb fingers between opposing ends thereof such that operation of the comb-drive element varies the capacitive gaps therebetween.

In some embodiments, a perimeter of the annulus-shaped resonator member is at least partially defined by respective sidewalls that are slanted at an angle relative to a plane defined by a surface of the resonator member. The gyroscope further includes respective tuning electrodes, which are slanted at respective angles parallel to the angle of the respective sidewalls of the annulus-shaped resonator member and separated therefrom by respective capacitive gaps. The respective tuning electrodes are configured to provide quadrature tuning between different resonance modes of the annulus-shaped resonator member.

Other apparatus and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 6A is a perspective view illustrating locally-engineered tether structures that couple an annulus resonator member to a central anchor structure in an annulus pitch/roll BAW gyroscope in accordance with some embodiments of the present disclosure.

FIGS. 6B and 6C are enlarged views illustrating deformation and displacement of the different locally-engineered tether structures of FIG. 6A.

DETAILED DESCRIPTION

Example embodiments of the present disclosure are directed to bulk acoustic wave (BAW) resonators actuated by sub-micron comb-drive elements, with particular embodiments directed to a substrate-decoupled annulus BAW pitch/roll gyroscope design with HARPSS™ fabricated nano-gap comb-drive structures and slanted sidewall electrodes. Such embodiments can improve performance of BAW resonators with respect to actuation range and quadrature error. While described primarily herein by way of example with reference to annulus pitch/roll BAW gyroscopes, it will be understood that the inventive concepts of the present disclosure are not so limited. More generally, embodiments of the present disclosure are applicable to any BAW resonator or inertial measurement apparatus that include drive electrodes, sense electrodes, tuning electrodes, and/or tether structures.

Inertial-grade MEMS gyroscope, especially pitch/roll gyroscope, is highly desired but not available in current market. Mode-matched annulus BAW gyroscope is a promising candidate for inertial-grade pitch/roll gyroscope due to its robustness and excellent vibration resistance. However, performance of annulus BAW gyroscopes may be limited by actuation range and fabrication imperfections.

Figure 1A:
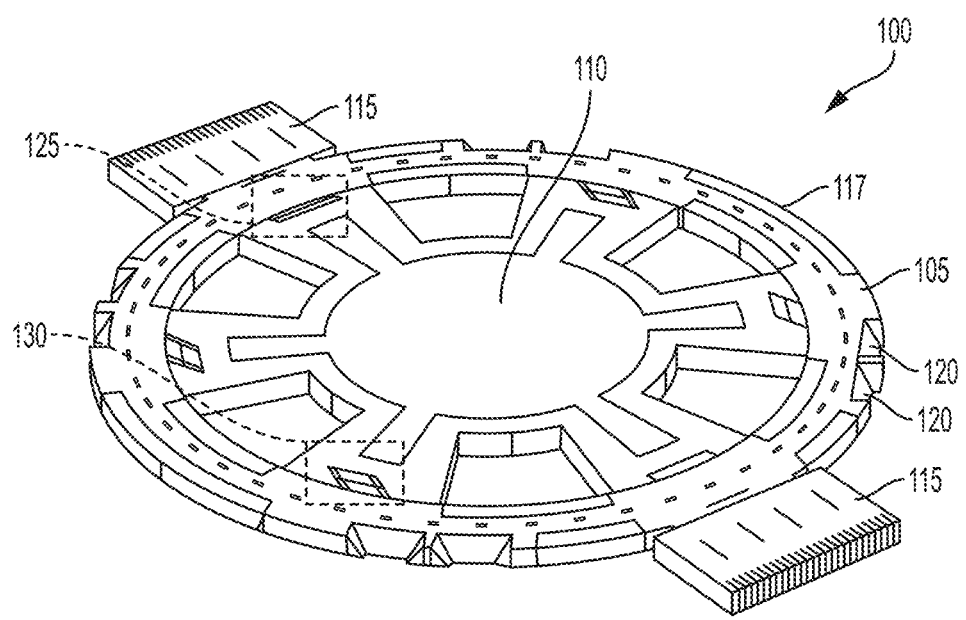
FIG. 1A is a perspective view illustrating an annulus pitch/roll BAW gyroscope including a sub-micron capacitive gap comb-drive in accordance with some embodiments of the present disclosure.

FIG. 1A is a perspective view illustrating a bulk acoustic wave (BAW) resonator apparatus 100, shown as an annulus pitch/roll BAW gyroscope, in accordance with some embodiments of the present disclosure. As shown in FIG. 1A, the bulk acoustic wave resonator apparatus 100 includes a resonator member 105, shown as an annulus, and an anchor structure 110 suspending the resonator member 105 over a substrate. The anchor structure 110 is shown as a disk-shaped unitary member that is coupled to the resonator member 105 at six locations within an interior of the annulus by way of example, but it will be understood that embodiments of the present disclosure may include multiple anchor structures and/or fewer or additional couplings to the interior and/or exterior of the resonator member. The BAW gyroscope 100 may have a resonance frequency of greater than 300 kHz, and in some embodiments, about 1 MHz or more. Additional features of annulus gyroscopes are described in U.S. Patent Application Publication No. 2013/0283911 entitled "MODE-MATCHED SINGLE PROOF-MASS'S DUAL-AXIS GYROSCOPE AND METHOD OF FABRICATION" to Ayazi, et al., the disclosure of which is incorporated by reference herein in its entirety.

Still referring to FIG. 1A, the BAW resonator apparatus 100 further includes comb-drive elements 115 connected to the resonator member 105 at a perimeter or edge 117 of the resonator member 105. The perimeter 117 of the resonator member 105 is at least partially defined by respective sidewalls 120 that are slanted at an angle relative to a plane defined by a surface of the resonator member 105. The anchor structure 110 is coupled to the resonator member 105 by respective tether structures 125, 130. The tether structures 125, 130 have different shapes at different locations of the interior of the resonator member 105 relative to the comb-drive elements 115.

Figure 1B:
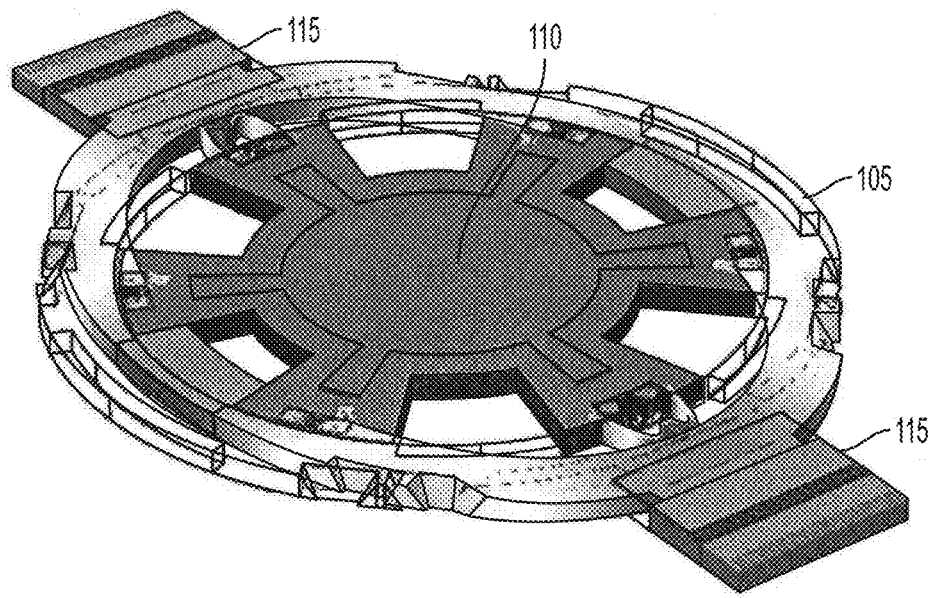
FIGS. 1B and 1C are perspective views illustrating displacement of an annulus resonator member in a drive mode and a sense mode, respectively, during operation of an annulus pitch/roll BAW gyroscope including a sub-micron capacitive gap comb-drive in accordance with some embodiments of the present disclosure.
Figure 1C:
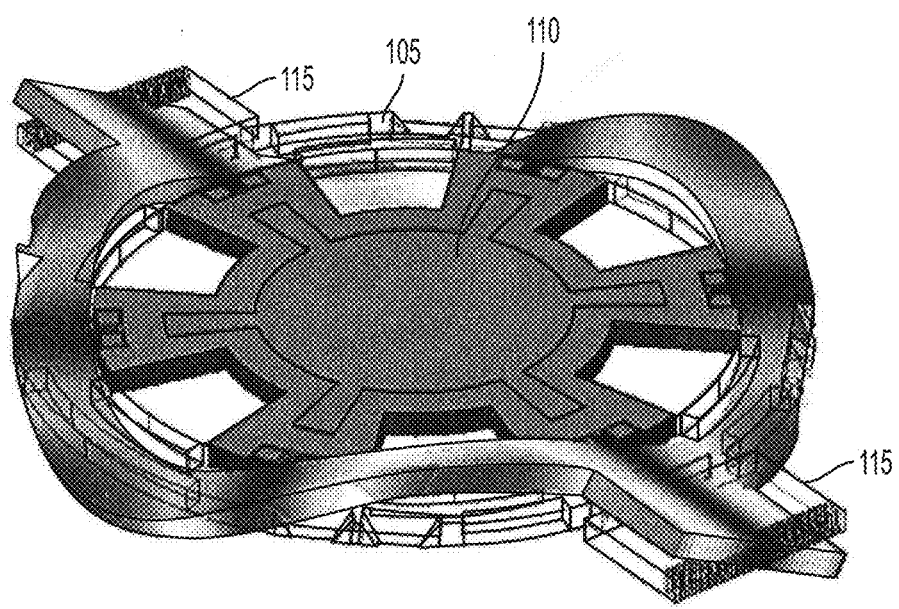

FIGS. 1B and 1C are perspective views illustrating displacement of an annulus resonator member 105 in a drive mode and a sense mode, respectively, during operation of an annulus pitch/roll BAW gyroscope apparatus 100 including a sub-micron capacitive gap comb-drive 115 in accordance with some embodiments of the present disclosure. As shown in FIGS. 1B and 1C, the apparatus 100 uses m=2 in-plane mode as the drive mode (FIG. 1B) and m=3 out-of-plane mode as the sense mode (FIG. 1C). Two comb-drive elements 115 are connected to the annulus resonator member 105 at the anti-nodal point of the drive mode. In some embodiments, a drive amplitude that is more than ten times greater than some conventional annulus gyroscope may be used. Since the mechanical noise level is inverse proportional to the drive amplitude, an annulus pitch/roll BAW gyroscope apparatus 100 including a sub-micron capacitive gap comb-drive 115 in accordance with some embodiments of the present disclosure may achieve significantly higher performance than some conventional annulus gyroscopes. In order to achieve the larger drive amplitude with linear transduction and reasonable motional impedance, a HARPSS™-fabricated sub-micron comb-drive 115 is used to actuate the BAW gyroscope 100, as described in greater detail below.

Figure 2:
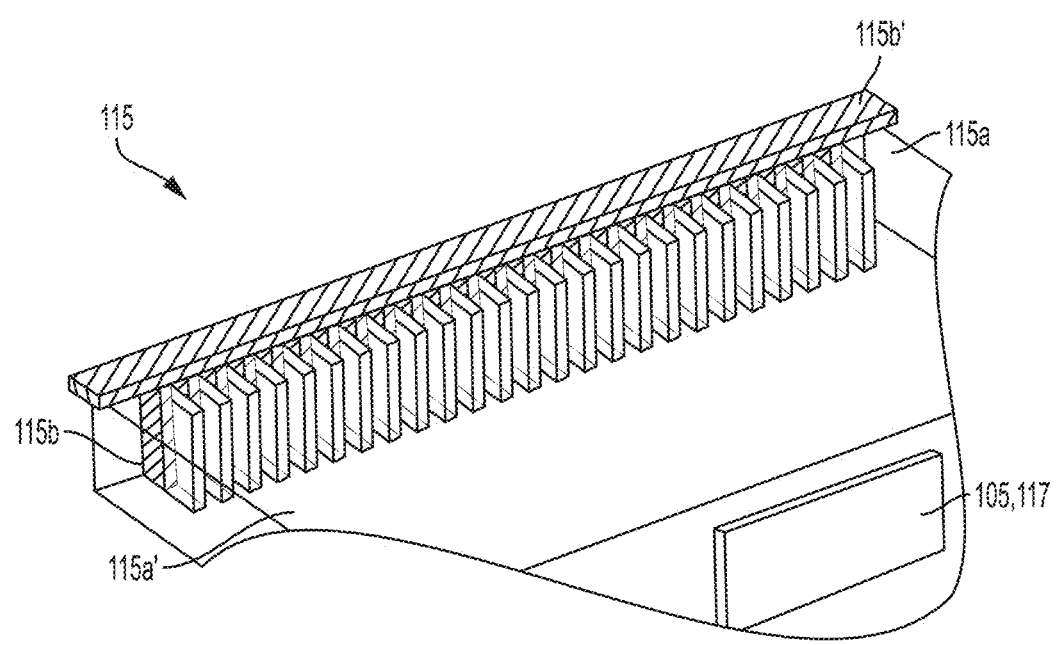
FIG. 2 is a perspective view illustrating interdigitated comb fingers of a sub-micron capacitive gap comb-drive in accordance with some embodiments of the present disclosure.

FIG. 2 is a perspective view of a translucent geometry model illustrating the positions of interdigitated heterogeneous comb fingers of a sub-micron capacitive gap comb-drive element in accordance with some embodiments of the present disclosure. The sub-micron capacitive gap comb-drive element of FIG. 2 represents one of the sub-micron capacitive gap comb-drive elements 115 of FIG. 1. As shown in FIG. 2, the sub-micron capacitive gap comb-drive element 115 (also referred to herein as a nano-gap comb-drive) includes first comb fingers 115a protruding away from the perimeter 117 of the resonator member 105, and second comb fingers 115b interdigitated with the first comb fingers 115a to define sub-micron capacitive gaps therebetween. The sub-micron capacitive gaps may be about 100 nanometers (nm) to about 500 nm in some embodiments. The first comb fingers 115a are formed from or otherwise include a different material composition than the second comb fingers 115b. When HARPSS™-fabricated, the first comb fingers 115a are formed from single-crystal silicon, while the second comb fingers 115b are formed from polysilicon. The first comb fingers 115a are continuously connected to one another at respective ends thereof 115a' adjacent the perimeter 117 of the resonator member 105. In some embodiments, the first comb fingers 115a integrally extend from the perimeter of the resonator member 105 to define a unitary member. The second comb fingers 115b are not connected to one another at either of the opposing ends thereof, but rather, are connected by a polysilicon layer 115b' at respective surfaces thereof opposite the substrate. In some embodiments, the polysilicon layer 115b' and the second comb fingers 115b define a unitary member.

Figure 3A:
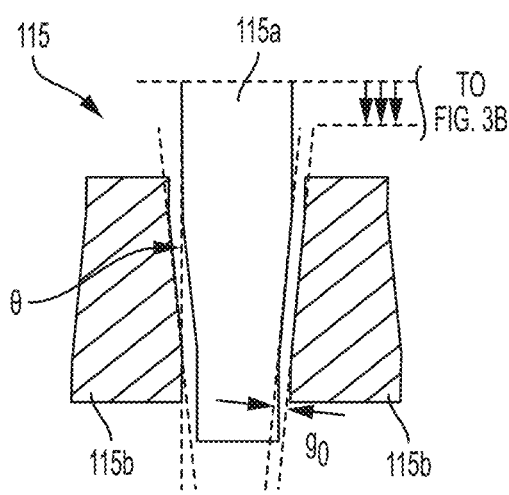
FIGS. 3A and 3B are plan view cross-sections illustrating interdigitated comb fingers and related operation of a sub-micron capacitive gap comb-drive in accordance with some embodiments of the present disclosure.
Figure 3B:
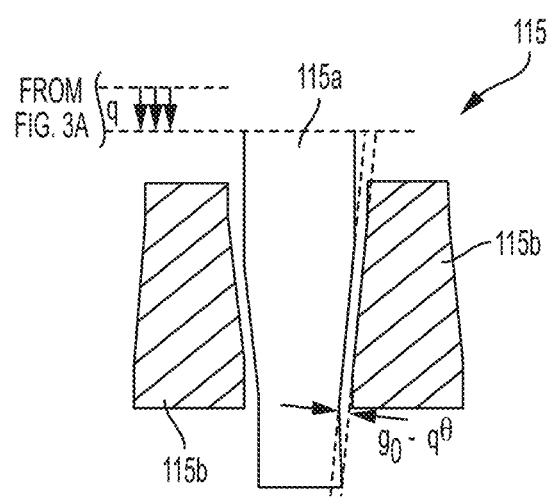

FIGS. 3A and 3B are plan view cross-sections illustrating interdigitated heterogeneous comb fingers and a gap-closing operation of the sub-micron capacitive gap comb-drive 115 of FIG. 2 in accordance with some embodiments of the present disclosure. As shown in FIGS. 3A and 3B, respective sidewalls of the interdigitated heterogeneous comb fingers 115a, 115b include tapered portions (illustrated as extending along the dotted lines). In particular, the respective sidewalls of the first comb fingers 115a are oppositely-tapered relative to respective sidewalls of the second comb fingers 115b. That is, the respective sidewalls of the first comb fingers 115a are tapered in a complementary manner (e.g., at a vertically-opposite angle) relative to the respective sidewalls of the second comb fingers 115b of a different material, such that the first comb fingers 115a and the second comb fingers 115b are configured to mate or accept one another when interdigitated. As such, operation of the comb-drive element 115 (illustrated as linear displacement q) varies or reduces the sub-micron capacitive gaps (from $g_0$ in FIG. 3A to $g_0-(q$ times $\theta)$ in FIG. 3B) at the respective sidewalls of the first and second comb fingers 115a, 115b, where $\theta$ represents the tapering angle (relative to a direction along a length of a non-tapered or rectangular comb finger). Such a gap-closing operation (instead of an overlapping area changing operation) is used to eliminate lithography dependency and achieve self-aligned comb-fingers 115a, 115b, where the set of shorter tapered polysilicon fingers 115b lie completely within trenches defined by the sidewalls of the set of longer single-crystal silicon fingers 115a, where the relative lengths of the heterogeneous comb fingers 115a, 115b are along a direction in which the sidewalls thereof extend. With a predetermined tapering angle $\theta$, the nano-gap comb-drive 115 can provide actuation forces similar to a HARPSS™-fabricated parallel-plate, but with a larger linear drive range. The electrostatic force $F_{electrostatic}$ and the linear drive range $q_{linear}$ are given by equations (1) below. In some embodiments, the tapering angle $\theta$ of the first comb fingers 115a and the second comb fingers 115b (which is defined relative to a direction along the lengths thereof) is selected or otherwise configured such that the linear drive range of the comb-drive element 115 can exceed the mechanical non-linearity limit of the resonator member 105.

The mechanical nonlinearity of BAW resonators can depend on the mode shape and doping level, and may be different for different resonator members. For high frequency BAW resonator, large mechanical nonlinearity is typically seen with amplitude in the order of a few hundred nanometers. The tapering angle is determined based on the desired amplitude and gap size according to the equations (1) provided below, where the actuation force is inversely proportional to the gap size. The tapering angle $\theta$ can thus be configured based on actuation force and linear drive/actuation range requirements. In some embodiments, for an annulus-type BAW resonator such as the BAW gyroscope 100, the tapering angle $\theta$ may be in a range of about 1 degree to about 5 degrees. In other embodiments, for an annulus-type BAW resonator such as the BAW gyroscope 900 discussed below with reference to FIGS. 9A and 9B, the tapering angle $\theta$ may be in a range of about 1 degree to about 10 degrees.

Figure 4A:
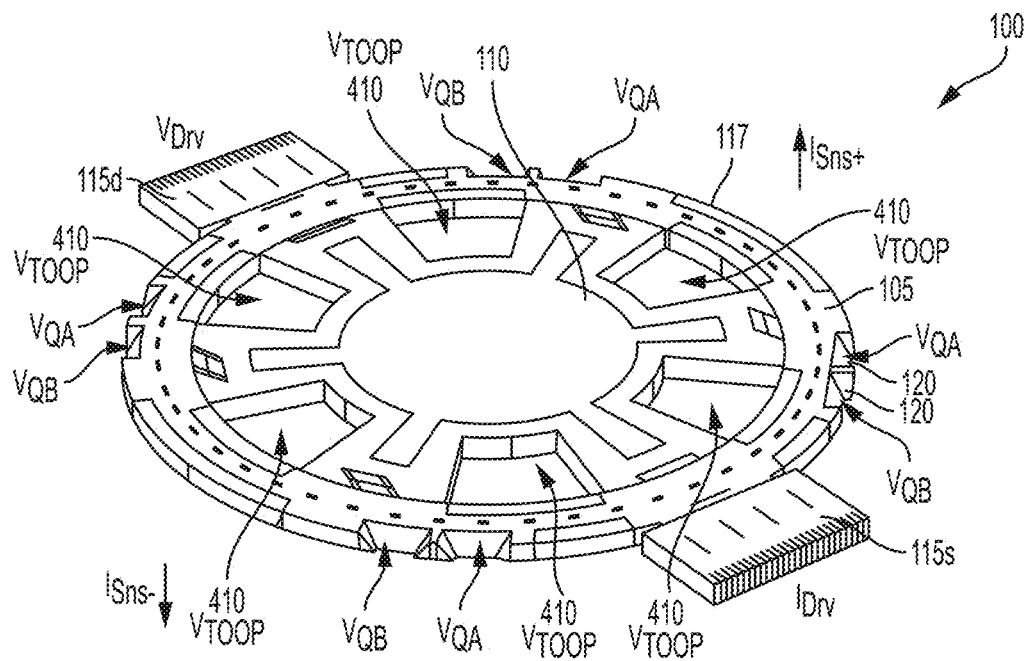
FIG. 4A is a perspective view illustrating areas for electrode placement in an annulus pitch/roll BAW gyroscope in accordance with some embodiments of the present disclosure.

FIG. 4A is a perspective view illustrating electrode configurations in the bulk acoustic wave (BAW) resonator apparatus 100 of FIG. 1A, again shown as an annulus pitch/roll BAW gyroscope, in accordance with some embodiments of the present disclosure. As shown in FIG. 4A, the annulus resonator member 105 is configured for placement of respective electrodes at various positions within the interior of the annulus and around the perimeter of the annulus to provide drive, sense, and tuning functions. In particular, in FIG. 4A, the apparatus 100 includes two comb-drive elements 115d, 115s. The first comb-drive element 115d is a drive or excitation electrode configured to be applied with a drive voltage $V_{Drv}$ to actuate the resonator member 105, and the second comb-drive element 115s is a sense or monitor electrode configured to output a current $I_{Drv}$ (corresponding to the in-plane drive mode), a current $I_{Sns+}$ (corresponding to a first out-of-plane sense mode that is orthogonal to the in-plane drive mode), and a current $I_{Sns-}$ (corresponding to a second out-of-plane sense mode that is orthogonal to the first out-of-plane sense mode and the in-plane drive mode), from which displacement of the resonator member 105 can be determined. Respective tuning electrodes, which are configured to be applied with out-of-plane tuning voltages $V_{TOOP}$, are provided in the hollow internal sections 410 defined between the anchor structure 110 and the annulus resonator member 105. Tuning electrodes that are configured to be applied with quadrature error cancellation voltages $V_{QA}$, $V_{QB}$ are provided at sidewalls 120 of the perimeter 117, which are slanted at an angle relative to a plane defined by a surface of the resonator member 105.

Figure 4B:
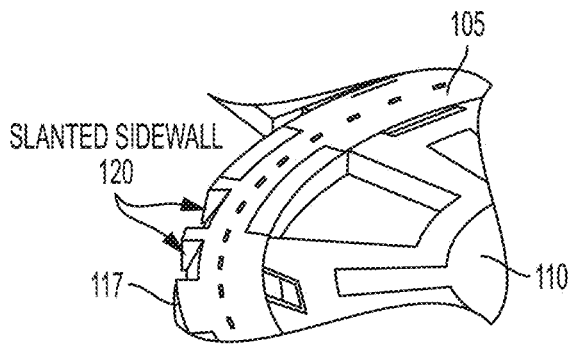
FIG. 4B is an enlarged perspective view illustrating slanted sidewall portions of an annulus resonator member in accordance with some embodiments of the present disclosure.
Figure 4C:
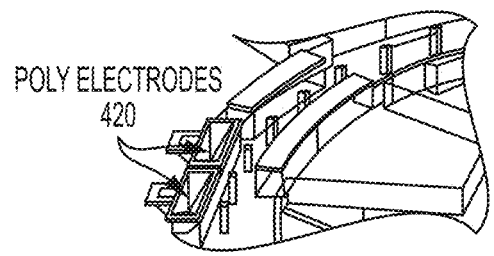
FIG. 4C is an enlarged perspective view illustrating tuning electrodes and placement in an annulus resonator member in accordance with some embodiments of the present disclosure.

FIG. 4B is an enlarged perspective view illustrating the slanted sidewall portions 120 of the annulus resonator member 105, while FIG. 4C is an enlarged perspective view illustrating the tuning electrodes and placement in the annulus resonator member 105, in accordance with some embodiments of the present disclosure. As shown in FIG. 4B, the perimeter 117 of the resonator member 105 is at least partially defined by respective sidewalls 120 that are slanted at an angle relative to a plane defined by a surface of the resonator member 105. As shown in FIG. 4C, respective tuning electrodes 420 are disposed adjacent the respective sidewalls 120 of the resonator member 105. The tuning electrodes may be polysilicon in some embodiments. The tuning electrodes 420 have sidewalls that are slanted at the same angle as (and thus, adapted to mate with) the sidewalls 120 of the resonator member 105. As shown in FIG. 4A, pairs of the tuning electrodes 420 (configured to be applied with voltages $V_{QA}$, $V_{QB}$) are separated from one another by approximately 90 degrees around the circumference of the annulus resonator member 105. In some embodiments, the tuning electrodes 420 are positioned in between the nodal points of the in-plane and out-of-plane modes.

Figure 4D:
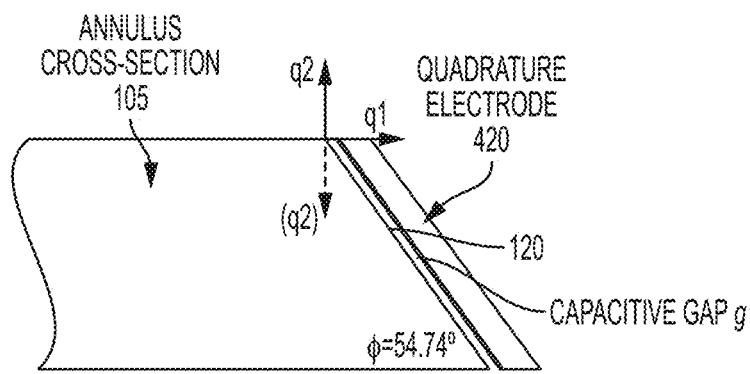
FIG. 4D is a partial cross-section illustrating slanted sidewall mating surfaces of an annulus resonator member and a tuning electrode in an annulus pitch/roll BAW gyroscope in accordance with some embodiments of the present disclosure.

FIG. 4D is a partial cross-section illustrating the slanted sidewall mating surfaces of the annulus resonator member 105 and a tuning electrode 420 in an annulus pitch/roll BAW gyroscope 100 in accordance with some embodiments of the present disclosure. As shown in FIG. 4D, a sidewall portion of the tuning electrode 420 is slanted at the same angle $\phi$ as the sidewall 120 of the resonator member 105 such that the slanted tuning electrode 420 and the slanted sidewall 120 of the annulus resonator member 105 are separated by a uniform capacitive gap g. Voltages $V_{QA}$, $V_{QB}$ may be applied to the tuning electrodes 420 to provide quadrature error cancellation. In particular, in annulus BAW gyroscopes, imperfections like DRIE trench tilting can cause cross-coupling between in-plane and out-of-plane modes (quadrature), which can prevent mode-matching and can degrade noise performance. Some embodiments of the present disclosure may implement slanted sidewalls 120 and slanted electrodes 420 used for quadrature error cancellation. The slanted sidewalls 120 are located at the circumference 117 of the annulus resonator member 105. In some embodiments, the slanted sidewalls 120 are fabricated by a post-DRIE anisotropic silicon wet etching. The gap size of the capacitive gap g between the slanted sidewalls 120 of the annulus 105 and the slanted sidewalls of the electrode 420 is selected or otherwise configured based on both in-plane and out-of-plane motion, which can allow for quadrature tuning.

Still referring to FIG. 4D, the angle φ of the slanted sidewall 120 may be about 30° to about 60°, for example, 45°. The angle φ of the slanted sidewall 120 is defined by the (111) crystal plane (relative to the (100) crystal plane) to be about 54.7° in some embodiments. This angle may be achieved, for example, by using a wet etching process that is selective to the (111) crystal plane. For an applied quadrature tuning voltage $V_{QA}$, $V_{QB}$, the tuning electrodes 420 are configured to produce a corresponding electrostatic force, which produces a torque in-between the in-plane and out-of-plane direction. This aligns each mode to the proper displacement plane, thus reducing or eliminating quadrature in some embodiments. Responsive to application of predetermined tuning voltages $V_{TOOP}$ and quadrature cancellation voltages $V_{QA}$, $V_{QB}$, the frequency of the in-plane drive mode, the first orthogonal out-of-plane sense mode, and/or the second orthogonal out-of-plane sense can be mode-matched, and the cross-coupling noise between in-plane and out-of-plane modes can be reduced or minimized. Additional features of slanted quadrature error cancellation electrodes are described in PCT/2016/37186 entitled "MEMS INERTIAL MEASUREMENT APPARATUS HAVING SLANTED ELECTRODES FOR QUADRATURE TUNING," to Ayazi et al., filed Jun. 13, 2016, the disclosure of which is incorporated by reference herein in its entirety.

Figures 5A, 5B:
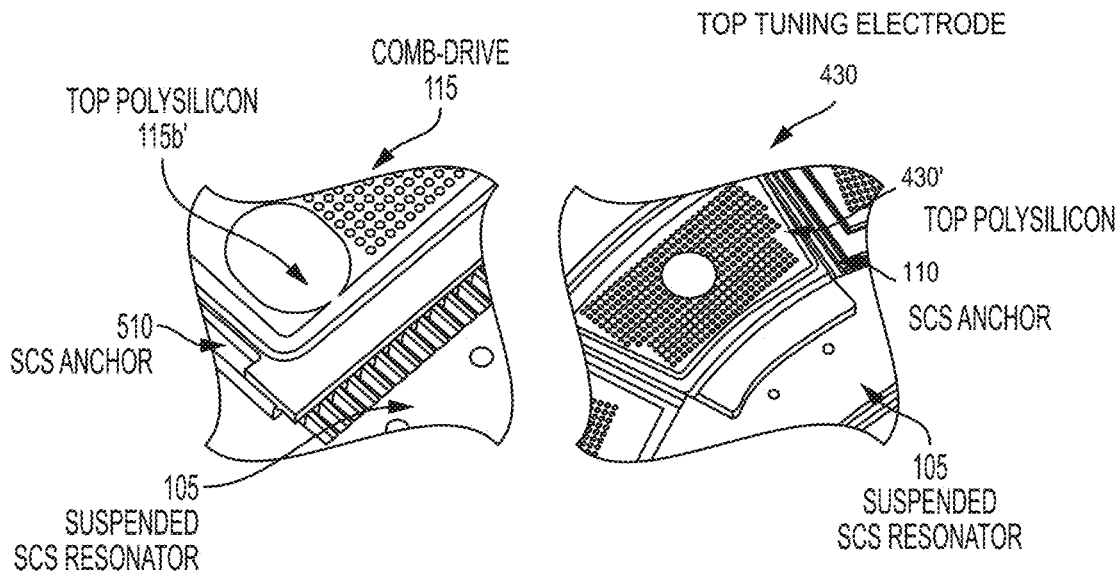
FIGS. 5A, 5B, and 5D are plan view scanning electron microscope (SEM) images illustrating a sub-micron capacitive gap comb-drive, a top tuning electrode, and a slanted tuning electrode, respectively, in accordance with some embodiments of the present disclosure.
Figure 5C:
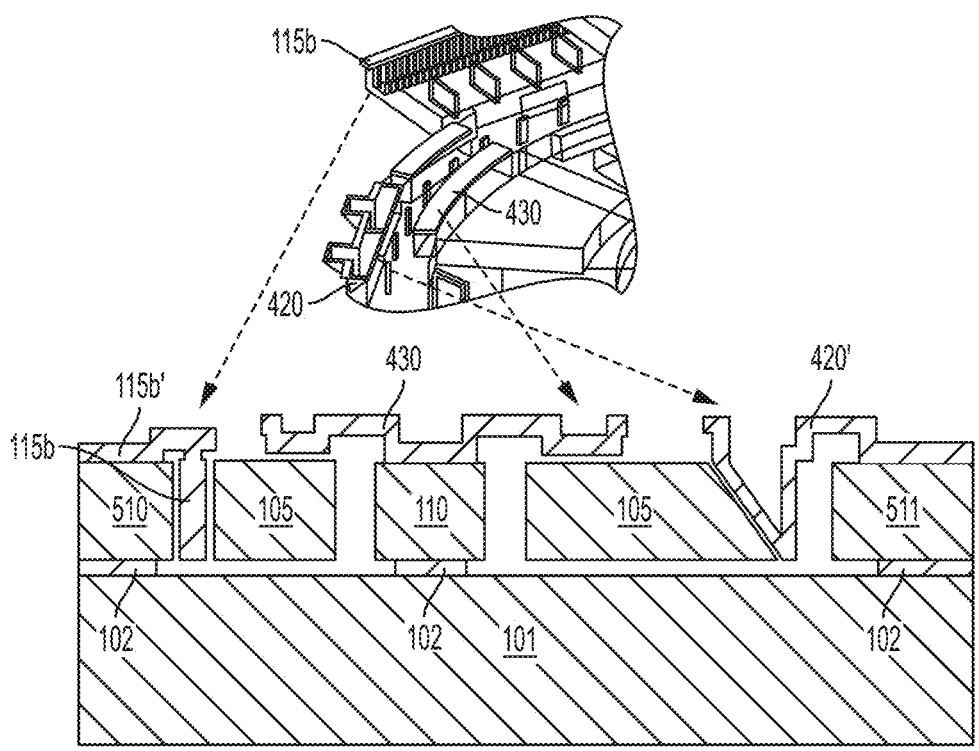
FIG. 5C is a cross-section illustrating attachment of a sub-micron capacitive gap comb-drive, annulus resonator member, top tuning/sensing electrodes, and a slanted tuning electrode to a substrate in an annulus pitch/roll BAW gyroscope in accordance with some embodiments of the present disclosure.
Figure 5D:
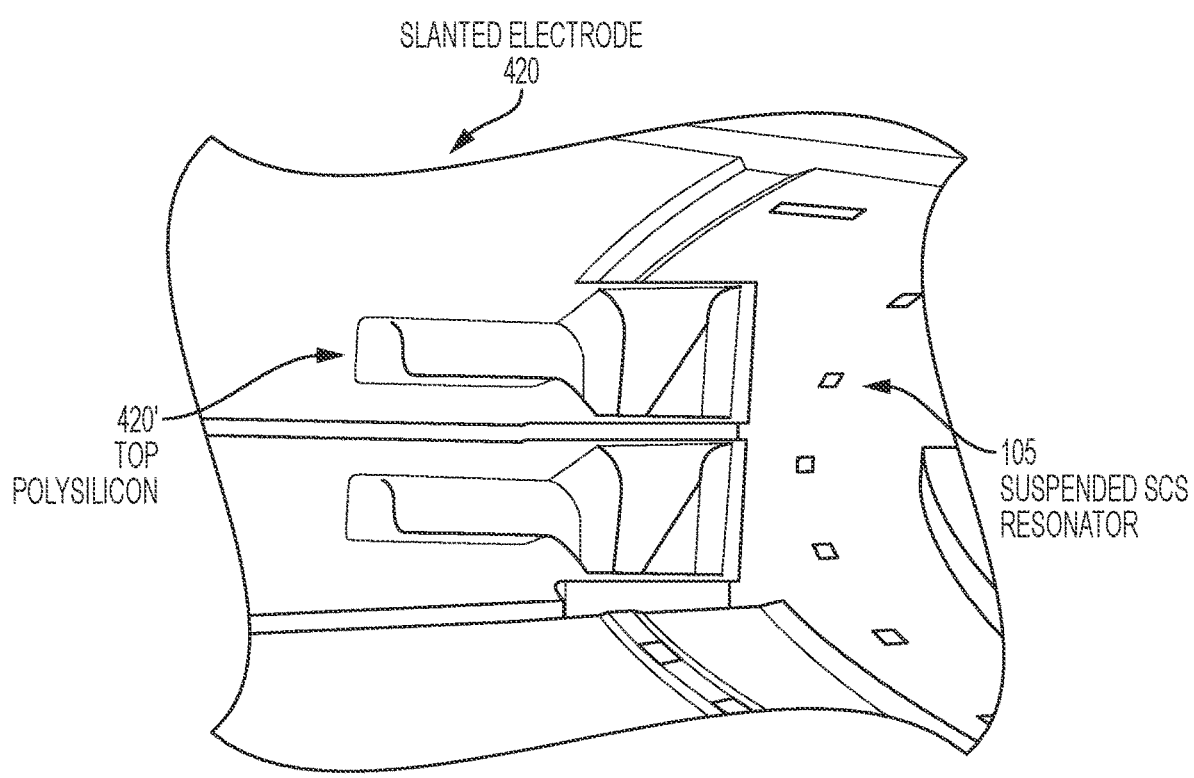

FIGS. 5A, 5B, and 5D are plan view scanning electron microscope (SEM) images illustrating a sub-micron capacitive gap comb-drive, a top tuning electrode, and a slanted tuning electrode, respectively, while FIG. 5C is a cross-section illustrating attachment of a sub-micron capacitive gap comb-drive, annulus resonator member, top tuning/sensing electrodes, and a slanted tuning electrode to a substrate in accordance with some embodiments of the present disclosure. As shown in FIGS. 5A and 5C, the comb-drive element 115 includes a top polysilicon layer 115b' (to which the second comb fingers 115b are connected), and a single crystal silicon (SCS) anchor structure 510 connects the top polysilicon layer 115b' to a portion of a buried oxide layer 102 on the substrate 101. A SCS anchor 110 suspends the annulus SCS resonator member 105 over the substrate 101. The SCS anchor 110 is connected to a portion of the buried oxide layer 102 on the substrate 101. Polysilicon layer portions 430' defining the top tuning electrode 430, as shown in FIGS. 5B and 5C, may also be connected to the SCS anchor 110. As shown in FIGS. 5C and 5D, the slanted electrode 420 is defined by a top polysilicon layer 420', and a SCS anchor 511 connects the top polysilicon layer 420' to a portion of the buried oxide layer 102 on the substrate 101.

FIG. 6A is a perspective view illustrating locally-engineered tether structures 125, 130 that couple an annulus resonator member 105 to a central anchor structure 110 in an annulus pitch/roll BAW gyroscope in accordance with some embodiments of the present disclosure. In contrast with the lower vibration resistance and reliability of some conventional low frequency MEMS gyroscopes, embodiments of the present disclosure may take advantage of BAW resonance modes by using locally engineered anchoring/tethering structures 125, 130, which may provide higher reliability. As shown in FIG. 6A, the annulus resonator member 105 is suspended to the anchor structure 110 by tether structures 125, 130. In the embodiment of FIG. 6A, the tether structures 125, 130 are located at nodal points of the out-of-plane sense mode. As shown in the enlarged portions of FIG. 6A, tether structures 125 and 130 at different locations of the interior of the annulus resonator member 105 have different shapes, and are locally engineered or configured to allow only in-plane movement that coincides with the local deformation of the in-plane drive mode. In particular embodiments, the tether structures 125 adjacent the comb-drive elements 115 have a same or symmetrical shape, which is different from the shape of the tether structures 130. Consequently, the annulus resonator member 105 can be substrate-decoupled for both the drive and sense mode, but rigid for translational motions, and can reject undesired deformations. FIGS. 6B and 6C are enlarged views illustrating compliant and rigid directions of the different locally-engineered tether structures of FIG. 6A. The structures of the tether elements 125, 130 can thus be configured to achieve low support loss, while keeping the frequencies of undesired translational modes high.

Embodiments of the present disclosure are directed to the design, fabrication and characterization of self-aligned nano-gap comb-drive actuators for high frequency bulk acoustic wave (BAW) resonators. The comb-drive is implemented to actuate a high-Q 1 MHz annulus BAW resonator with gyroscopic modes. Some embodiments can achieve a linear force density of about 261.5 $pN/V^2$ μm. As a result, vibration amplitudes as large as 350 nm can be measured using relatively small voltages. An equivalent model estimation of the mechanical nonlinearity of the resonator indicates a spring hardening effect at large displacements. Features of such embodiments are further described in the publication "*HARPSS-Fabricated Nano-Gap Comb-Drive for Efficient Linear Actuation f High Frequency BAW Resonators*" to Wen, et al., IEEE International Micro Electro Mechanical Systems Conference (MEMS 2016), Shanghai, China, January 2016, pp. 1014-1017, the disclosure of which is incorporated by reference herein in its entirety.

High frequency BAW resonators and BAW inertial sensors are increasingly used for high performance sensor applications, due for example to their small size, robustness, and high quality factor (Q). Due to their high stiffness, efficient actuation of these devices presents a challenge. Capacitive transduction is typically used in MEMS as it provides high Q and clean spectrum. BAW devices typically rely on parallel-plate actuation, as comb-gaps of conventional comb-drives are in the range of a few microns, and thus may yield insufficient force to actuate BAW resonators. A High Aspect-Ratio Polysilicon and Single-crystal Silicon (HARPSS™) process can provide parallel-plate transducers with nano-gaps, which can be used to achieve relatively low motional resistance ($R_m$) in capacitive BAW resonators.

Although a HARPSS™-fabricated parallel-plate capacitor can offer efficient actuation for BAW resonators, it has a disadvantage of a small linear actuation range, typically limited to about 10% of the gap. For a typical HARPSS™ gap of 200 nm, the linear drive amplitude is less than 20 nm. On the other hand, larger resonance amplitude is favorable for many MEMS applications. For example, in MEMS oscillators, larger resonance amplitude can offer lower phase noise, and in MEMS gyroscopes, sensitivity and noise performance can improve linearly with increased drive amplitude.

BAW resonators may have improved power handling as compared to low-frequency flexural resonators. Nevertheless, in many applications, the energy storage of BAW resonators may be limited by electrical nonlinearity, and an advantage of large intrinsic power handling capability is not fully exploited. Therefore, an actuator design with high actuation force and large linear actuation range may be desirable.

Some embodiments of the present disclosure provide a sub-micron gap comb-drive actuator that provides actuation forces similar to a HARPSS™ parallel-plate actuator, but with a much larger linear drive amplitude. In particular, embodiments of the present disclosure provide a self-aligned HARPSS™-fabricated nano-gap comb-drive actuators, which offers a high actuation force density for high frequency (e.g., greater than 300 kHz) BAW resonators, while increasing the linear drive range by about 10 times or more compared to nano-gap parallel-plate actuators. With reduced electrical nonlinearity, the mechanical nonlinearity of BAW resonators (specifically, the m=2 wineglass mode of an annulus BAW resonator) is estimated with an equivalent length-extension (LE) model, and can be confirmed by experimental measurements.

In HARPSS™ processes, thermal oxidation of silicon is used to define nano-gaps between single crystal silicon (SCS) comb finger electrodes and polysilicon comb finger electrodes. The SCS comb fingers and polysilicon comb fingers are interdigitated and may include tapered SCS fingers and self-aligned polysilicon fingers formed by trench refilling, separated with nano-scale capacitive gaps. In particular, implementation of comb-drives using a HARPSS™ process in accordance with some embodiments of the present disclosure involves: (i) SCS deep reactive ion etching (DRIE) to form one set of comb-fingers; (ii) thermal oxidation to define gap size; and (iii) polysilicon trench refilling and selective etching to form the other set of comb-fingers. The comb-drive operates in a gap-closing mode, and the tapering angle is selected or otherwise configured based on actuation force and linear actuation range requirements.

Figures 7A, 7B:
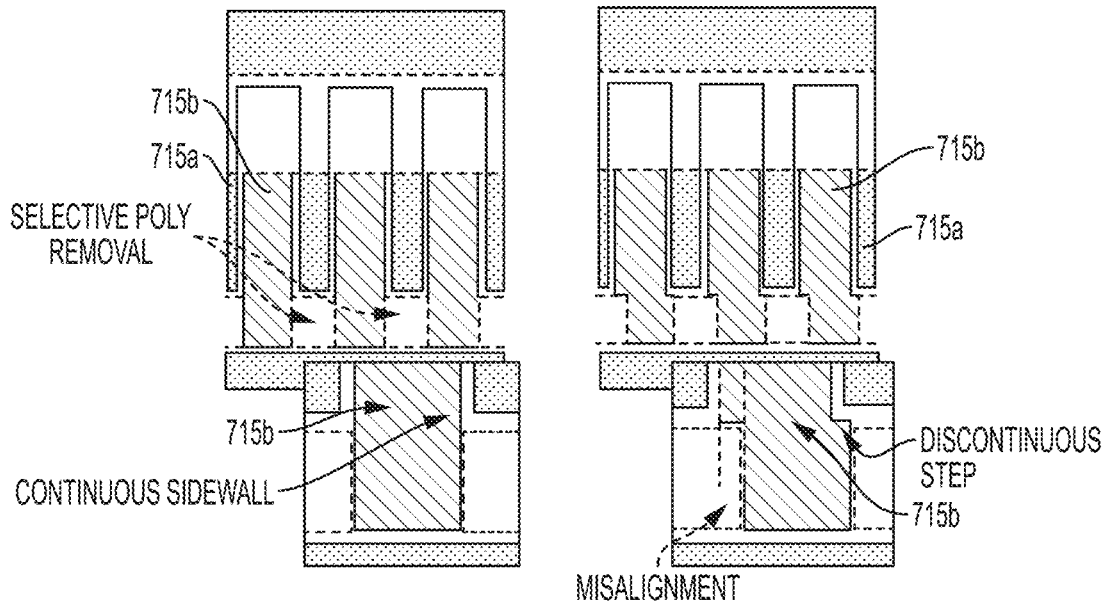
FIGS. 7A and 7B are plan views illustrating some conventional comb-drive elements and related fabrication techniques.

Conventionally, some comb-drives may rely on the change of overlapping area between comb-fingers, which requires surface continuity at the overlapping/non-overlapping boundary. FIGS. 7A and 7B are schematic plan views of comb-fingers fabricated with HARPSS™ processes. In particular, FIG. 7A illustrates an ideal area-changing comb-drive, while FIG. 7B illustrates a non-ideal area-change comb-drive. In HARPSS™, polysilicon fingers 715b are formed by selective DRIE of polysilicon from refilled trenches between sidewalls of SCS fingers 715a. Their sidewall profile depends on lithography and etching accuracy. The sidewall is only continuous in an ideal case with perfect alignment and etching, as shown in FIG. 7A. In reality, misalignment and etching imperfections exist. When the gaps between the fingers are in nano-scale, small misalignment can cause significant surface discontinuity and steps that disable the comb-drive, as shown in FIG. 7B. That is, HARPSS™-fabrication processes may not be successfully used to implement area-changing comb-drives.

Figure 8:
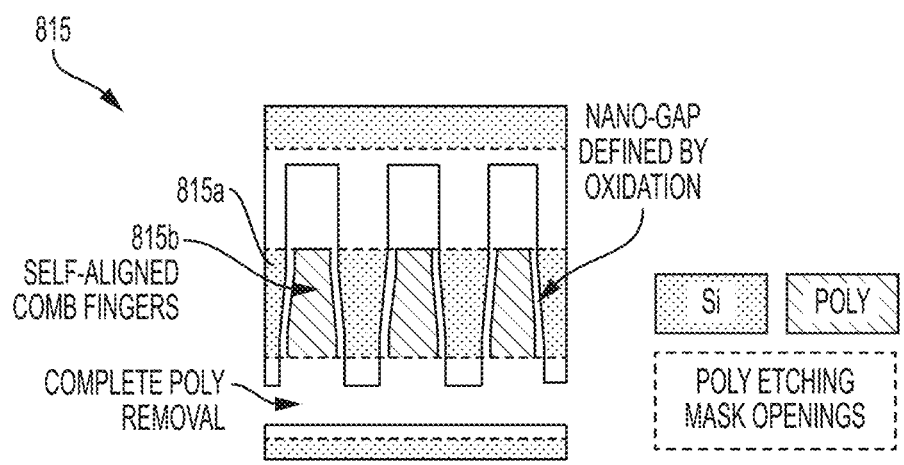
FIG. 8 is a plan view illustrating a sub-micron comb-drive element and related fabrication techniques in accordance with some embodiments of the present disclosure.

FIG. 8 is a schematic plan views of comb-fingers fabricated with HARPSS™ processes in accordance with embodiments of the present disclosure. In particular, FIG. 8 illustrates a self-aligned gap-closing comb-drive 815, where the comb-fingers 815a, 815b are tapered and the gap size varies when the two sets of fingers 815a, 815b move relatively. For gap-closing operation, surface continuity is not required. Therefore, a gap-closing operation may be used to eliminate lithography dependency and achieve self-aligned comb-fingers. As shown in FIG. 8, polysilicon is etched off completely on both ends of the polysilicon fingers 815b. The poly etching mask openings indicate the locations where polysilicon inside the trenches (defined between sidewalls of the SCS comb fingers 815a) is removed during poly patterning step. This forms tapered polysilicon fingers 815b with a self-aligned nature, such that shape and functionality of the fingers 815b are not affected by lithography accuracy. As discussed above with reference to FIGS. 3A and 3B, the gap-closing operation has a finite linear range; however, with tapering angles in accordance with embodiments described herein, this range can be pushed beyond a mechanical nonlinearity limit. The electrostatic force $F_{electrostatic}$ and the linear drive range $q_{linear}$ of the comb-drive are given by:

$$F_{electrostatic} = \frac{1}{2}\frac{2N\varepsilon t L_{comb}\sin\theta}{g_0^2}V^2, \quad (1)$$

$$q_{linear} = \frac{0.1 g_0}{\sin\theta},$$

where N, t, $L_{comb}$, $\theta$, and $g_0$ are the number of fingers, device thickness, length of the tapered region, tapering angle, and gap size. It can be seen from equation (1) that reducing $\theta$ increases linear range with the cost of reduced force. This trade-off can be compensated by increasing $L_{comb}$ or N. In some embodiments, $\theta$ may generally have a range between about 1 and 10 degrees. Also, since the electrostatic force is inversely proportional to $g_0^2$, HARPSS™ enabled nano-gap improves the transduction efficiency significantly.

Figure 9B:
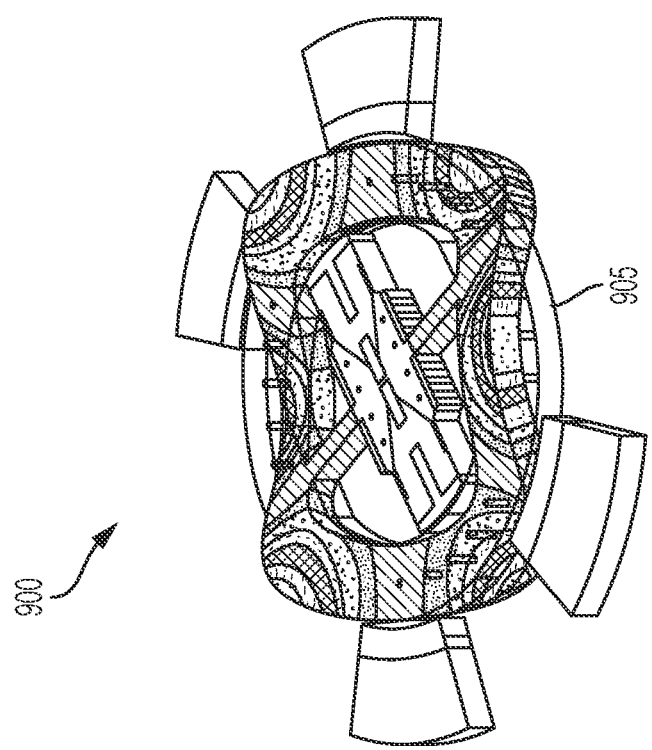
FIGS. 9A and 9B are perspective views illustrating displacement of an annulus resonator member in a drive mode and a sense mode, respectively, of an annulus pitch/roll BAW gyroscope including a sub-micron capacitive gap comb-drive in accordance with some embodiments of the present disclosure.
Figure 9A:
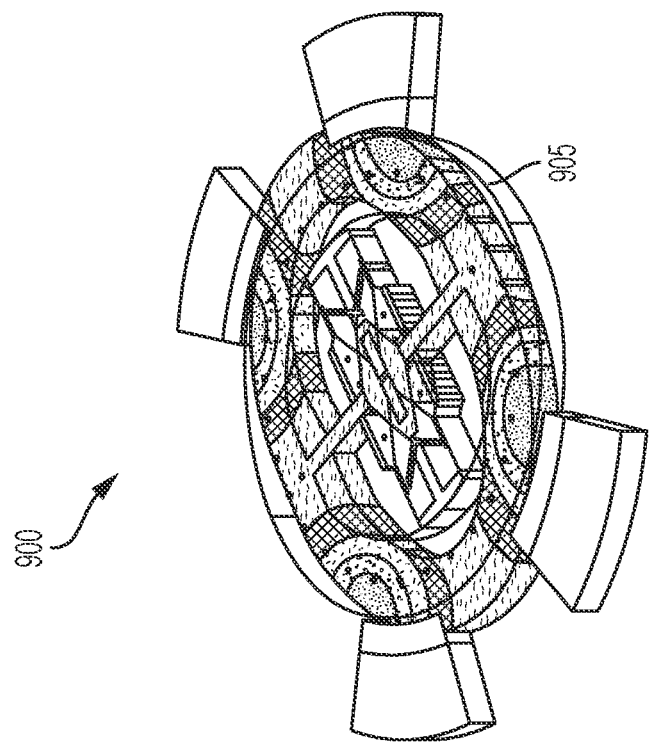

In some embodiments described herein, a nano-gap comb-drive actuator is implemented to actuate an annulus resonator member 905 in its m=2 wineglass mode at a resonance frequency of about 1 MHz. As shown in FIGS. 9A and 9B, an annulus BAW resonator 900 can be used as a Coriolis pitch/roll gyroscope with m=2 in-plane wineglass mode as drive mode (FIG. 9A) and m=3 out-of-plane mode as sense mode (FIG. 9B). Implementation of comb-drive can thus improve BAW gyroscope performance with increased drive amplitudes.

A maximum resonance amplitude (q) subject to the device nonlinearity can be evaluated by the amplitude-frequency (A-f) effect (shift in resonance frequency at large q):

$$f_0'=(1+\kappa q^2)f_0, \quad (2)$$

where $\kappa$ is the A-f coefficient. Nonlinearity in a capacitive resonator includes electrical and mechanical nonlinearity. Electrical nonlinearity causes spring softening effect, and mechanical nonlinearity can cause either spring softening or hardening effect. Electrical nonlinearity is expected to be minimal or negligible in comb-drive, and mechanical nonlinearity may thus be more dominant. Mechanical nonlinearity of a SCS resonator may vary with mode shape, doping level, and crystal orientation. As the m=2 wineglass mode of an SCS annulus resonator may have complex strain distribution, in order to estimate mechanical nonlinearity of the wineglass mode, an equivalent lumped-element (LE) model with scaled nonlinear Young's modulus (which can be characterized with LE simulations) may be used.

Figure 10:
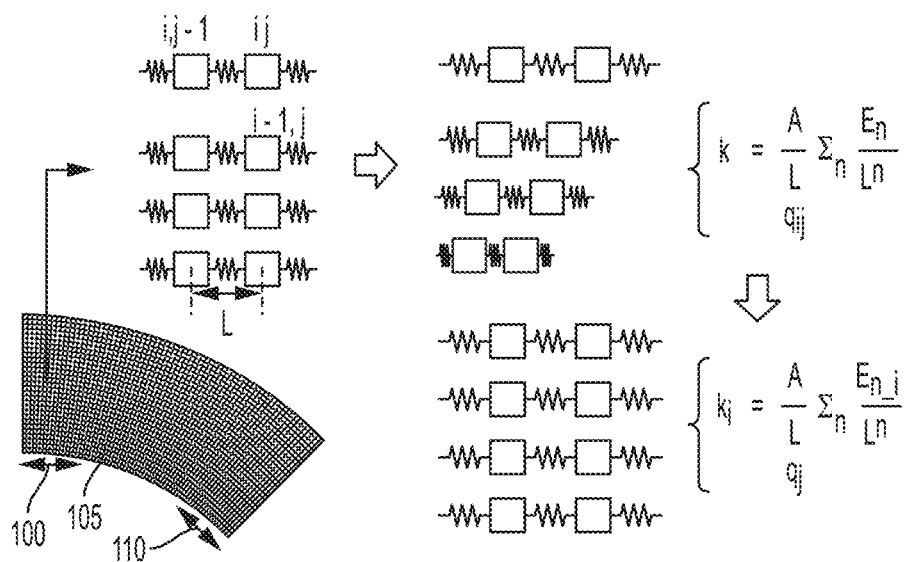
FIG. 10 illustrates an equivalent model of an annulus resonator member in accordance with some embodiments of the present disclosure.

FIG. 10 illustrates an equivalent LE model of an annulus resonator member 1005 in accordance with some embodiments of the present disclosure. In particular, as shown in FIG. 10, the annulus 105 may be mapped into small non-linear spring-mass elements, and i-distribution is transferred from q to k, resulting in a LE mode shape with the same nonlinearity. In the annulus wineglass mode, radial and shear stress are relatively small and their contribution to nonlinearity can be negligible. The Lagrangian function of the resonator system is given by:

$$L = \sum_{ij}(T_{ij} - U_{ij}) = \sum_{ij}\left[\frac{1}{2}L_i A \rho \dot{q}_{ij}^2 - \sum_n \frac{k_n}{n+2}(q_{ij} - q_{i,j-1})^{n+2}\right] \quad (3)$$

$$= \sum_{ij} L_i A \left[\frac{1}{2}\rho \dot{q}_{ij}^2 - \sum_n \frac{E_n}{n+2}\left(\frac{\Delta L_{ij}}{L_i}\right)^{n+2}\right]$$

$$= \sum_{ij} L_i A \left(\frac{1}{2}\rho \dot{q}_{ij}^2 - \sum_n \frac{E_n}{n+2} S_{ij}^{n+2}\right),$$

where $q_{ij}$, $S_{ij}$, $L_i$, $A$, and $E_n$ are the displacement vector, strain, length, cross-section area, and nth order Young's modulus of element ij. Based on Lagrangian mechanics:

$$\frac{d}{dt}\left(\frac{\partial L}{\partial \dot{q}}\right) - \frac{\partial L}{\partial q} = \sum_{ij}\left[\frac{d}{dt}\left(\rho \dot{q}_{ij}\frac{\partial \dot{q}_{ij}}{\partial \dot{q}}\right) + \sum_n E_n S_{ij}^{n+1}\frac{\partial S_{ij}}{\partial q}\right] = 0 \quad (4)$$

As shown in FIG. 10, the resonator is divided into (100) and (110) sections to partially preserve the anisotropy, and $E_n$ is constant in each section. Defining $f_i$ as the normalized i-distribution (width-distribution) of strain results in:

$$\sum_{ij}\left[\frac{d}{dt}\left(c_{1\_ij}\rho \dot{q}\frac{\partial \dot{q}}{\partial \dot{q}}\right) + \sum_n E_n(f_i S_j)^{n+1} f_i \frac{\partial S_j}{\partial q}\right] = \quad (5)$$

$$c_1 \rho \ddot{q} + \sum_{ij}\left[\sum_n (E_n f_i^{n+2}) S_j^{n+1}\frac{\partial S_j}{\partial q}\right] =$$

$$c_1 \rho \ddot{q} + \sum_j\left[\sum_n (a_n E_n) S_j^{n+1}\frac{\partial S_j}{\partial q}\right] = c_1 \rho \ddot{q} + \sum_j E' S_j \frac{\partial S_j}{\partial q}$$

$S_j$ is i-index averaged strain with only j-distribution (arc-distribution), and $c_1$, $a_n$ are integration constants. For infinitesimal elements, $a_n$ is given by:

$$a_n = \int_0^{W_{annulus}} \frac{(f(w))^{n+2}}{W_{annulus}} dw \quad (6)$$

with the distribution function $f(w)$ evaluated numerically in FEM simulation. The Lagrangian equation (4) becomes:

$$c_1 \rho \ddot{q} + \sum_j E' S_j \frac{\partial S_j}{\partial q} = c_1 \rho \ddot{q} + c_2 \sum_j k'_j \frac{\partial (q_j - q_{j-1})^2}{\partial q} = 0 \quad (7)$$

The arc-distribution of strain in the wineglass mode resembles the length-distribution in LE mode. Therefore, equation (7) represents a LE resonator with a scaled nonlinear Young's modulus E', which leads to the same $\Delta f/fS^2$ value as the annulus resonator, where S is the maximum strain. The length ($c_2$) and density ($c_1$) of the LE resonator may then be adjusted (for example, in FEM simulation) to achieve the same S/q and $f$ as the annulus resonator, thus the same $\kappa = \Delta f/q^2$.

Figure 11A:
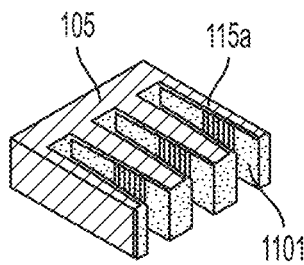
FIGS. 11A-11G are perspective views illustrating example operations for fabricating self-aligned interdigitated comb fingers of a comb-drive element using a HARPSS™ fabrication process in accordance with some embodiments of the present disclosure.
Figure 11B:
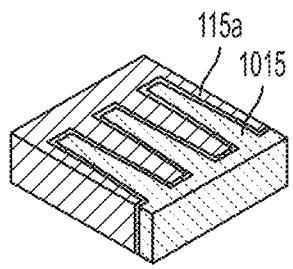
Figure 11C:
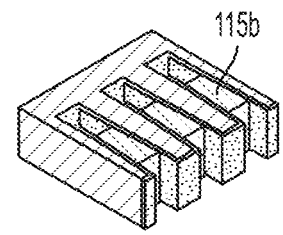

FIGS. 11A-11G are perspective views illustrating a process flow for fabricating self-aligned interdigitated comb fingers of a comb-drive element using a HARPSS™ fabrication process in accordance with some embodiments of the present disclosure. A comb-drive annulus BAW resonator may be designed with the m=2 mode aligned to (100) direction. For example, the resonator member 105 may be fabricated through a HARPSS™ process on a silicon-on-insulator (SOI) wafer with 40 µm thick, 15 mΩcm phosphorus-doped device layer. In particular, as shown in FIG. 11A, a single-crystal silicon (SCS) device layer, which may be part of or integral to the resonator member 105, is etched by DRIE to define SCS comb fingers 115a and oxidized to form an oxide layer 1101 (for example, a 190 nm-thick oxide layer) on the sidewalls of the comb fingers 115a. In FIG. 11B, trenches defined by the sidewalls of comb fingers 115a are filled by LPCVD polysilicon 1015. Portions of the polysilicon 1015 on top is etched back, and portions of the polysilicon 1015 in the trench are patterned to define polysilicon comb fingers 115b, as shown in FIG. 11C. The respective lengths of the SCS comb fingers 115a are longer than the respective lengths of the polysilicon comb fingers 115b in a direction along the respective sidewalls thereof.

Figure 11D:
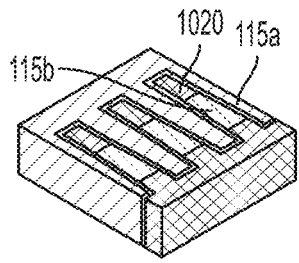
Figure 11E:
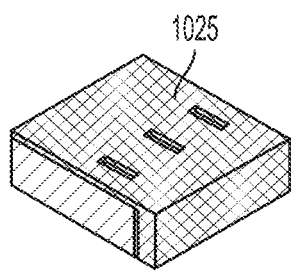
Figure 11F:
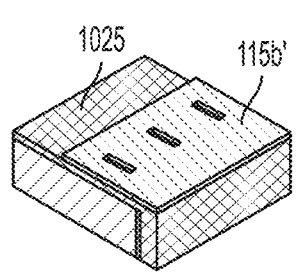
Figure 11G:
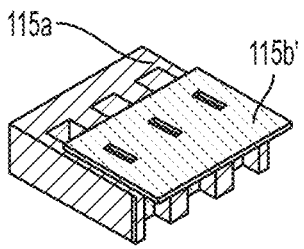

In FIG. 11D, tetraethyl orthosilicate (TEOS) silicon oxide 1020 is used to refill the trench, and is etched back from the top. A top TEOS layer 1025 is deposited and patterned, as shown in FIG. 11E, to define openings therein for connections to the polysilicon comb fingers 115b. In FIG. 11F, a top polysilicon layer 115b' is deposited and patterned to form connections to the polysilicon comb fingers 115 through the openings in the top TEOS layer 1025. HF is then used to remove the TEOS 1020, 1025 and sacrificial oxide 1101 and release the device, as shown in FIG. 11G, forming the completed comb-drive, where the polysilicon comb fingers 115b are self-aligned within trenches defined by the respective sidewalls of the SCS comb fingers 115a.

Figure 12A:
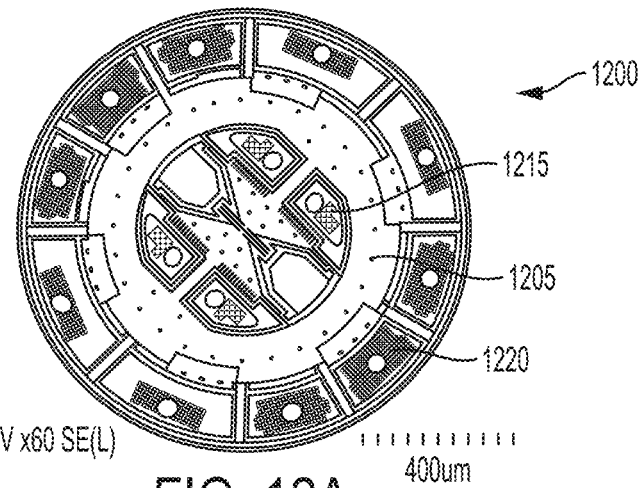
FIGS. 12A, 12B, and 12C are scanning electron microscope (SEM) images illustrating a plan view of a comb-drive annulus BAW resonator, an enlarged view of the comb-drive structure, and an enlarged view of the interdigitated comb fingers and nano-gap of the comb-drive annulus BAW resonator, respectively, in accordance with some embodiments of the present disclosure.
Figure 12B:
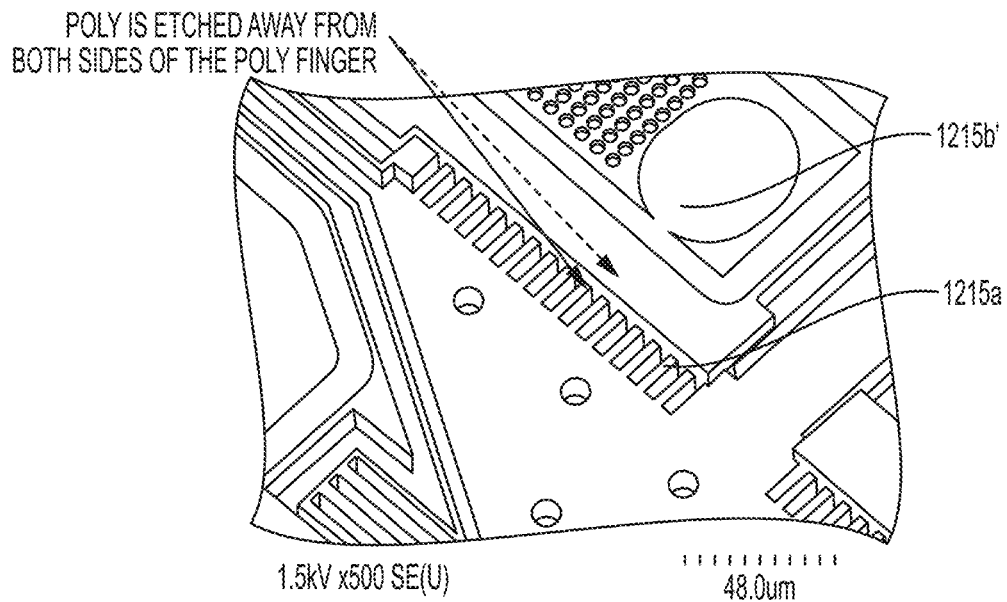
Figure 12C:
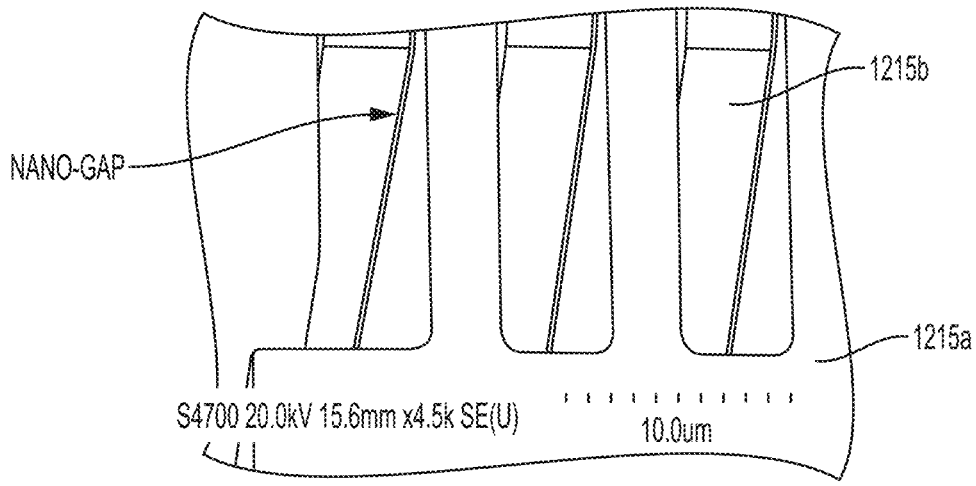

FIGS. 12A, 12B, and 12C are scanning electron microscope (SEM) images illustrating a plan view of a comb-drive annulus BAW resonator 1200 in accordance with some embodiments of the present disclosure. In particular, FIG. 12A illustrates the elements of the BAW resonator, including annulus resonator member 1205, top tuning electrodes 1220, and comb-drive element 1215. FIG. 12B is an enlarged view of the comb-drive structure 1215 including the top polysilicon layer 1215', and FIG. 12C is an enlarged view of the interdigitated comb fingers 1215a, 1215b and nano-gaps of the comb-drive structure 1215. In FIG. 12C, the comb-fingers 1215a, 1215b are separated by 190 nm gaps. In particular, some parameters used in the comb-drive shown in FIGS. 12A-12C are N=31, $L_{comb}$=5 µm, θ=2.4°, and $g_0$=190 nm. Based on equation (1) and simulated effective mass $M_{eff}$=16.7 µg, resonance frequency f=1 MHz, and Q=180k of the resonator, the linear drive range, electrostatic force density, and $R_m$ may be calculated to be 453.7 nm, 251.3 pN/V² µm and 77.6 kΩ.

The frequency response of the m=2 wineglass mode may be measured to verify agreement with simulation data. In some embodiments, a high-Q of ~178,000 may be measured at 0.983 MHz with $V_p$=22V, matching the value of Q given by FEM thermoelastic damping (TED) simulations. The resonance response $R_m$ of the resonator may also be evaluated to verify agreement with the theoretical value. In some embodiments, $R_m$ may be 71.2 kΩ. From the definition of $R_m$ we have:

$$R_m = \frac{i_d}{v_d} = V_p \frac{dC}{dx} \frac{dx}{dt} \frac{1}{v_d} = \frac{V_p^2 Q}{\omega M_{eff}} \left(\frac{dC}{dx}\right)^2 \Rightarrow \frac{dC}{dx} = \frac{1}{V_p} \sqrt{\frac{\omega M_{eff}}{R_m Q}}. \quad (8)$$

The force density may be evaluated using $R_m$, Q, and ω as:

$$f_{comb} = \frac{F_{comb}}{2NW_{comb} V^2_{applied}} = \frac{V^2_{applied}}{4NW_{comb} V^2_{applied}} \frac{dC}{dx} = \frac{1}{4NV_p W_{comb}} \sqrt{\frac{\omega M_{eff}}{R_m Q}} = 261.5 \frac{pN}{V^2_{\mu m}}. \quad (9)$$

BAW resonator apparatus including nano-gap comb-drives in accordance with some embodiments of the present disclosure may achieve a force density of 261.5 pN/V² µm or more, which may be significantly improved compared to other comb-drive designs. A significant improvement may be attributable to implementing nano-gaps in accordance with processes described herein.

Nonlinearity of the resonator may be characterized by increasing $v_d$ with constant $V_p$. At each $v_d$, the drive amplitude may be calculated using measured $R_m$ and Q:

$$q_{drive} = \frac{QV_p v_d}{\omega^2 M_{eff}} \frac{dC}{dx} = v_d \sqrt{\frac{Q}{\omega^3 M_{eff} R_m}} \quad (10)$$

During the $v_d$ sweeping, no spring softening effect may be observed, which may verify the reduced electrical nonlinearity of the comb-drive transducer. With $q_{drive}$ exceeding 200 nm (10× larger than the linear range of some parallel-plate designs), the resonance peak bends to higher frequency for larger AC voltage, showing that a spring hardening effect starts to emerge. Spring hardening effect in BAW gyroscopes can be further exploited for nonlinearity cancellation in large drive amplitude gyroscope designs according to some embodiments described herein.

According to some embodiments of the present disclosure, a nano-gap (190 nm) comb-drive actuator may be implemented on a 40 µm thick device layer substrate using a HARPSS™ fabrication process. A high linear force density (e.g., up to 261.5 pN/V² µm), as well as efficient linear actuation over a 200 nm range can be achieved in some embodiments of a 1 MHz annulus BAW resonator, indicating some benefits of using a comb-drive actuator for high frequency BAW resonators. Mechanical nonlinearity measurements on the annulus BAW resonators may be made possible by the larger linear actuation range, and spring hardening effects may be observed.

The present inventive concepts have been described with reference to the accompanying drawings, in which embodiments of the inventive concepts are shown. However, the present disclosure should not be construed as limited to the embodiments set forth herein. Rather, these embodiments are provided so that this disclosure will be thorough and complete, and to fully convey the scope of the embodiments to those skilled in the art. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, elements, and/or components, but do not preclude the presence or addition of one or more other features, steps, elements, components, and/or groups thereof. As used herein, the term "and/or" includes any and all combinations of one or more of the associated listed items.

It will also be understood that when an element is referred to as being "on," "coupled to," "connected to," or "responsive to" another element, it can be directly "on," "coupled to," "connected to," or "responsive to" the other element, or intervening elements may be present. In contrast, when an element is referred to as being "directly on," "directly coupled to," "directly connected to," or "directly responsive to" another element, there are no intervening elements present. It will also be understood that the sizes and relative orientations of the illustrated elements are not shown to scale, and in some instances they have been exaggerated for purposes of explanation.

Spatially relative terms, such as "above," "below," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

It will be understood that, although the terms "first," "second," etc. may be used herein to describe various elements, these elements should not be limited by these terms. These terms are only used to distinguish one element from another. Thus, a first element could be termed a second element without departing from the teachings of the present embodiments.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which these embodiments belong. It will be further understood that terms, such as those defined in commonly-used dictionaries, should be interpreted as having a meaning that is consistent with their meaning in the context of the relevant art and will not be interpreted in an idealized or overly-formal sense unless expressly so defined herein.

The foregoing is illustrative of the present disclosure and is not to be construed as limiting thereof. Although a few exemplary embodiments have been described, those skilled in the art will readily appreciate that many modifications are possible in the exemplary embodiments without materially departing from the teachings and advantages of the inventive concepts. Accordingly, all such modifications are intended to be included within the scope of the inventive concepts as defined in the claims.

That which is claimed:

1. A method of fabricating a bulk acoustic wave resonator apparatus, the method comprising:
    forming a comb-drive element connected to a resonator member, the comb-drive element comprising first comb fingers protruding from the resonator member, and second comb fingers interdigitated with the first comb fingers to define sub-micron capacitive gaps therebetween,
    wherein one of the first comb fingers and the second comb fingers are longer than the other of the first comb fingers and the second comb fingers along respective lengths between opposing ends thereof,
    wherein operation of the comb-drive element varies the sub-micron capacitive gaps at respective sidewalls of the first and second comb fingers without altering an amount of overlap between the first and second comb fingers along the respective lengths thereof.

2. The method of claim 1, wherein forming the comb-drive element comprises:
    forming the first comb fingers of a first material; and
    forming the second comb fingers of a second material different from the first material.

3. The method of claim 2, wherein forming the comb-drive element comprises:
    forming respective sidewalls of the second comb fingers to be oppositely-tapered relative to respective sidewalls of the first comb fingers between the opposing ends thereof.

4. The method of claim 3, wherein the respective sidewalls of the first and second comb fingers are tapered at an angle relative to the respective lengths thereof such that a linear drive range of the comb-drive element exceeds a mechanical non-linearity limit of the resonator member.

5. The method of claim 4, wherein the resonator member comprises an annulus, and wherein the angle is in a range of about 1 degree to about 5 degrees.

6. The method of claim 3, wherein forming the second comb fingers comprises:
    forming the second comb fingers to be free of connection to one another at both of the opposing ends thereof.

7. The method of claim 6, wherein the first comb fingers are longer than the second comb fingers along the respective lengths between the opposing ends thereof, and wherein forming the second comb fingers comprises forming the second comb fingers confined within trenches defined by the respective sidewalls of the first comb fingers.

8. The method of claim 7, wherein forming the second comb fingers comprises:
    forming an oxide layer along the respective sidewalls of the first comb fingers comprising the first material defining the trenches;
    forming the second comb fingers comprising the second material within the trenches such that the opposing ends thereof are not connected to one another; and
    removing the oxide layer such that the second comb fingers are self-aligned within the trenches.

9. The method of claim 6, wherein the first material is single-crystal silicon.

10. The method of claim 9, wherein the second material is polysilicon, and further comprising:
    forming a polysilicon layer connecting the second comb fingers at respective surfaces thereof such that the polysilicon layer and the second comb fingers define a unitary member.

11. The method of claim 10, wherein the resonator member is coupled to a substrate by at least one anchor structure, and wherein the polysilicon layer is coupled to the substrate by a single crystal silicon anchor.

12. The method of claim 9, wherein the resonator member comprises single-crystal silicon, and wherein forming the first comb fingers comprises:
    forming the first comb fingers to be connected at the opposing ends thereof adjacent a perimeter of the resonator member such that the resonator member and the first comb fingers define a unitary member.

13. The method of claim 1, wherein the sub-micron capacitive gaps are between about 100 nanometers (nm) and 500 nm, and wherein a resonance frequency of the bulk acoustic wave resonator apparatus is greater than about 300 kHz.

14. The method of claim 1, wherein the bulk acoustic wave resonator apparatus is gyroscope, and wherein the resonator member is an annulus.

15. The method of claim 14, wherein forming the comb-drive element comprises:
    forming the comb-drive element connected to a perimeter of the annulus at an anti-nodal point for an in-plane drive mode thereof, wherein movement of the resonator member in the in-plane drive mode is parallel to a plane defined by a surface of a substrate.

* * * * *

UNITED STATES PATENT AND TRADEMARK OFFICE
CERTIFICATE OF CORRECTION

PATENT NO. : 11,566,898 B2
APPLICATION NO. : 17/463689
DATED : January 31, 2023
INVENTOR(S) : Wen et al.

It is certified that error appears in the above-identified patent and that said Letters Patent is hereby corrected as shown below:

In the Specification

Column 1, Line 46: Please correct "f-Q" to read --f·Q--

Column 16, Lines 1-4, Formula (7): Please remove:

$$c_1\rho\ddot{q} + \sum_j E'S_j \frac{\partial S_j}{\partial q} = c_1\rho\ddot{q} + c_2 \sum_j k_j \frac{\partial (q_j - q_{j-1})^2}{\partial q} = 0$$

And replace with the following:

$$c_1\rho\ddot{q} + \sum_j E'S_j \frac{\partial S_j}{\partial q} = c_1\rho\ddot{q} + c_2 \sum_j \frac{1}{2} k_j' \frac{\partial (q_j - q_{j-1})^2}{\partial q} = 0$$

Signed and Sealed this
Twenty-third Day of May, 2023

*Katherine Kelly Vidal*

Katherine Kelly Vidal
*Director of the United States Patent and Trademark Office*